(12) United States Patent
Bandyopadhyay et al.

(10) Patent No.: US 9,472,301 B2
(45) Date of Patent: Oct. 18, 2016

(54) DIELECTRIC-BASED MEMORY CELLS HAVING MULTI-LEVEL ONE-TIME PROGRAMMABLE AND BI-LEVEL REWRITEABLE OPERATING MODES AND METHODS OF FORMING THE SAME

(71) Applicant: SanDisk 3D LLC, Milpitas, CA (US)

(72) Inventors: Abhijit Bandyopadhyay, San Jose, CA (US); Tanmay Kumar, Pleasanton, CA (US); Scott Brad Herner, San Jose, CA (US); Christopher J. Petti, Mountain View, CA (US); Roy E. Scheuerlein, Cupertino, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/804,126

(22) Filed: Jul. 20, 2015

(65) Prior Publication Data

US 2015/0325310 A1    Nov. 12, 2015

Related U.S. Application Data

(62) Division of application No. 13/780,089, filed on Feb. 28, 2013, now abandoned.

(51) Int. Cl.
*G11C 17/16* (2006.01)
*G11C 17/18* (2006.01)
(Continued)

(52) U.S. Cl.
CPC ......... *G11C 17/165* (2013.01); *G11C 11/5692* (2013.01); *G11C 17/18* (2013.01);
(Continued)

(58) Field of Classification Search
CPC .. G11C 17/165; G11C 11/5692; G11C 17/18
See application file for complete search history.

(56) References Cited

U.S. PATENT DOCUMENTS 5,311,039 A    5/1994  Kimura et al.
5,373,169 A   12/1994  McCollum et al.
(Continued)

FOREIGN PATENT DOCUMENTS

| JP | 08-316324 | 11/1996 |
|---|---|---|
| JP | 2005-123575 | 5/2005 |
| WO | 2005124787 | 12/2005 |

OTHER PUBLICATIONS

Office Action dated Apr. 11, 2014 in U.S. Appl. No. 14/176,882.
(Continued)

*Primary Examiner* — Hoai V Ho
*Assistant Examiner* — Tri Hoang
(74) *Attorney, Agent, or Firm* — Vierra Magen Marcus LLP

(57) ABSTRACT

A method of programming a memory cell is provided. The memory cell includes a memory element having a first conductive material layer, a first dielectric material layer above the first conductive material layer, a second conductive material layer above the first dielectric material layer, a second dielectric material layer above the second conductive material layer, and a third conductive material layer above the second dielectric material layer. One or both of the first and second conductive material layers comprises a stack of a metal material layer and a highly doped semiconductor material layer. The memory cell has a first memory state upon fabrication corresponding to a first read current. The method includes applying a first programming pulse to the memory cell with a first current limit. The first programming pulse programs the memory cell to a second memory state that corresponds to a second read current greater than the first read current.

16 Claims, 15 Drawing Sheets

(51) Int. Cl.
   *G11C 11/56* (2006.01)
   *H01L 27/112* (2006.01)
   *H01L 27/102* (2006.01)
   *H01L 45/00* (2006.01)
   *H01L 29/861* (2006.01)
   *H01L 27/24* (2006.01)

(52) U.S. Cl.
   CPC ..... *H01L27/1021* (2013.01); *H01L 27/11206* (2013.01); *H01L 27/2409* (2013.01); *H01L 27/2418* (2013.01); *H01L 27/2481* (2013.01); *H01L 29/8615* (2013.01); *H01L 45/04* (2013.01); *H01L 45/1233* (2013.01); *H01L 45/1253* (2013.01); *H01L 45/145* (2013.01); *H01L 45/146* (2013.01); *H01L 45/147* (2013.01); *H01L 45/1675* (2013.01)

(56) References Cited

U.S. PATENT DOCUMENTS

| | | |
|---|---|---|
| 5,379,250 A | 1/1995 | Harshfield |
| 5,475,253 A | 12/1995 | Look et al. |
| 5,486,707 A | 1/1996 | Look et al. |
| 5,688,158 A | 11/1997 | Jones et al. |
| 5,818,749 A | 10/1998 | Harshfield |
| 5,915,167 A | 6/1999 | Leedy |
| 6,034,882 A | 3/2000 | Johnson et al. |
| 6,100,120 A | 8/2000 | Yu |
| 6,306,715 B1 | 10/2001 | Chan et al. |
| 6,342,414 B1 | 1/2002 | Xiang et al. |
| 6,351,406 B1 | 2/2002 | Johnson et al. |
| 6,369,421 B1 | 4/2002 | Xiang et al. |
| 6,376,787 B1 | 4/2002 | Martin et al. |
| 6,403,434 B1 | 6/2002 | Yu |
| 6,420,215 B1 | 7/2002 | Knall et al. |
| 6,426,891 B1 | 7/2002 | Katori |
| 6,434,060 B1 | 8/2002 | Tran et al. |
| 6,451,641 B1 | 9/2002 | Halliyal et al. |
| 6,451,647 B1 | 9/2002 | Yang et al. |
| 6,455,424 B1 | 9/2002 | McTeer et al. |
| 6,456,524 B1 | 9/2002 | Perner et al. |
| 6,465,804 B1 | 10/2002 | Shamir |
| 6,475,874 B2 | 11/2002 | Xiang et al. |
| 6,483,734 B1 | 11/2002 | Sharma et al. |
| 6,486,065 B2 | 11/2002 | Vyvoda et al. |
| 6,490,218 B1 | 12/2002 | Vyvoda et al. |
| 6,492,241 B1 | 12/2002 | Rhodes et al. |
| 6,495,437 B1 | 12/2002 | Yu |
| 6,514,808 B1 | 2/2003 | Samavedam et al. |
| 6,515,888 B2 | 2/2003 | Johnson et al. |
| 6,525,953 B1 | 2/2003 | Johnson |
| 6,534,403 B2 | 3/2003 | Cleeves |
| 6,534,841 B1 | 3/2003 | Van Brocklin et al. |
| 6,549,447 B1 | 4/2003 | Fricke et al. |
| 6,551,885 B1 | 4/2003 | Yu |
| 6,552,409 B2 | 4/2003 | Taussig et al. |
| 6,559,014 B1 | 5/2003 | Jeon |
| 6,574,145 B2 | 6/2003 | Kleveland et al. |
| 6,579,760 B1 | 6/2003 | Lung |
| 6,580,115 B2 | 6/2003 | Agarwal |
| 6,586,349 B1 | 7/2003 | Jeon et al. |
| 6,587,394 B2 | 7/2003 | Hogan |
| 6,617,639 B1 | 9/2003 | Wang et al. |
| 6,661,691 B2 | 12/2003 | Fricke et al. |
| 6,686,646 B2 | 2/2004 | Lee |
| 6,689,644 B2 | 2/2004 | Johnson |
| 6,690,597 B1 | 2/2004 | Perlov et al. |
| 6,704,235 B2 | 3/2004 | Knall et al. |
| 6,750,079 B2 | 6/2004 | Lowrey |
| 6,753,561 B1 | 6/2004 | Rinerson et al. |
| 6,784,517 B2 | 8/2004 | Kleveland et al. |
| 6,816,410 B2 | 11/2004 | Kleveland et al. |
| 6,822,888 B2 | 11/2004 | Peng |
| 6,842,369 B2 | 1/2005 | Koll et al. |
| 6,879,505 B2 | 4/2005 | Scheuerlein |
| 6,906,361 B2 | 6/2005 | Zhang |
| 6,937,507 B2 | 8/2005 | Chen |
| 6,937,509 B2 | 8/2005 | Perner et al. |
| 6,937,528 B2 | 8/2005 | Hush et al. |
| 6,952,030 B2 | 10/2005 | Herner et al. |
| 7,009,694 B2 | 3/2006 | Hart et al. |
| 7,012,297 B2 | 3/2006 | Bhattacharyya |
| 7,052,941 B2 | 5/2006 | Lee |
| 7,172,840 B2 | 2/2007 | Chen |
| 7,176,064 B2 | 2/2007 | Herner et al. |
| 7,206,214 B2 | 4/2007 | Hoefler et al. |
| 7,271,081 B2 | 9/2007 | Li et al. |
| 7,303,971 B2 | 12/2007 | Hsu et al. |
| 7,304,888 B2 | 12/2007 | Knall |
| 7,405,465 B2 | 7/2008 | Herner |
| 7,410,838 B2 | 8/2008 | Ang |
| 7,453,755 B2 | 11/2008 | Cleeves |
| 7,488,625 B2 * | 2/2009 | Knall ............... G11C 17/16 257/E27.02 |
| 7,499,355 B2 * | 3/2009 | Scheuerlein ......... G11C 5/145 365/201 |
| 7,575,984 B2 | 8/2009 | Radigan et al. |
| 7,608,514 B2 | 10/2009 | Hsu |
| 7,629,198 B2 | 12/2009 | Kumar et al. |
| 7,633,108 B2 | 12/2009 | Li et al. |
| 7,649,768 B2 | 1/2010 | Hirose |
| 7,706,169 B2 | 4/2010 | Kumar |
| 7,718,546 B2 | 5/2010 | Radigan et al. |
| 7,863,598 B2 | 1/2011 | Sugita et al. |
| 7,875,871 B2 | 1/2011 | Kumar |
| 7,920,408 B2 | 4/2011 | Azuma et al. |
| 7,968,419 B2 | 6/2011 | Li et al. |
| 8,058,636 B2 | 11/2011 | Osano et al. |
| 8,072,795 B1 | 12/2011 | Wang et al. |
| 8,093,682 B2 | 1/2012 | Hirose |
| 8,148,711 B2 | 4/2012 | Fujii et al. |
| 8,183,553 B2 | 5/2012 | Phatak et al. |
| 8,279,657 B2 | 10/2012 | Takagi et al. |
| 8,339,834 B2 | 12/2012 | Nakai et al. |
| 8,343,813 B2 | 1/2013 | Kuse et al. |
| 8,362,454 B2 | 1/2013 | Lee et al. |
| 8,410,467 B2 | 4/2013 | Wada |
| 8,558,208 B2 | 10/2013 | Fujitsuka et al. |
| 8,563,366 B2 | 10/2013 | Pramanik et al. |
| 8,592,798 B2 | 11/2013 | Mikawa et al. |
| 8,995,172 B2 | 3/2015 | Wang et al. |
| 2002/0019039 A1 | 2/2002 | Davis et al. |
| 2002/0070754 A1 | 6/2002 | Lambertson |
| 2002/0086476 A1 | 7/2002 | Kim et al. |
| 2003/0026158 A1 | 2/2003 | Knall et al. |
| 2003/0062595 A1 | 4/2003 | Anthony |
| 2003/0081445 A1 | 5/2003 | Van Brocklin et al. |
| 2003/0169625 A1 | 9/2003 | Hush et al. |
| 2004/0002184 A1 | 1/2004 | Cleeves |
| 2004/0016991 A1 | 1/2004 | Johnson et al. |
| 2004/0108573 A1 | 6/2004 | Herner et al. |
| 2004/0183144 A1 | 9/2004 | Beaman et al. |
| 2004/0245547 A1 | 12/2004 | Stipe |
| 2005/0014322 A1 | 1/2005 | Herner et al. |
| 2005/0026334 A1 | 2/2005 | Knall |
| 2005/0052915 A1 | 3/2005 | Herner et al. |
| 2005/0098800 A1 | 5/2005 | Herner et al. |
| 2005/0121742 A1 | 6/2005 | Petti et al. |
| 2005/0121743 A1 | 6/2005 | Herner |
| 2005/0124116 A1 | 6/2005 | Hsu |
| 2005/0221200 A1 | 10/2005 | Chen |
| 2005/0226067 A1 | 10/2005 | Herner et al. |
| 2006/0073642 A1 | 4/2006 | Yeh et al. |
| 2006/0076549 A1 | 4/2006 | Ufert |
| 2006/0171200 A1 | 8/2006 | Rinerson et al. |
| 2006/0197115 A1 | 9/2006 | Toda |
| 2006/0197180 A1 | 9/2006 | Lai et al. |
| 2006/0203541 A1 | 9/2006 | Toda |
| 2006/0249753 A1 | 11/2006 | Herner et al. |
| 2006/0250837 A1 | 11/2006 | Herner et al. |
| 2006/0252281 A1 | 11/2006 | Park et al. |
| 2006/0268594 A1 | 11/2006 | Toda |
| 2006/0273298 A1 | 12/2006 | Petti et al. |

(56) References Cited

U.S. PATENT DOCUMENTS

| | | |
|---|---|---|
| 2007/0008773 A1 | 1/2007 | Scheuerlein |
| 2007/0015330 A1 | 1/2007 | Li et al. |
| 2007/0015348 A1 | 1/2007 | Hsu et al. |
| 2007/0069241 A1 | 3/2007 | Yang et al. |
| 2007/0072360 A1 | 3/2007 | Kumar et al. |
| 2007/0087508 A1 | 4/2007 | Herner |
| 2007/0190722 A1 | 8/2007 | Herner |
| 2007/0228414 A1 | 10/2007 | Kumar et al. |
| 2007/0228442 A1 | 10/2007 | Kakimoto |
| 2008/0025078 A1 | 1/2008 | Scheuerlein et al. |
| 2008/0090337 A1 | 4/2008 | Williams |
| 2008/0128853 A1 | 6/2008 | Choi et al. |
| 2008/0219039 A1 | 9/2008 | Kumar et al. |
| 2008/0239790 A1 | 10/2008 | Herner et al. |
| 2008/0278988 A1 | 11/2008 | Ufert |
| 2009/0003036 A1 | 1/2009 | Kumar |
| 2009/0004786 A1 | 1/2009 | Radigan et al. |
| 2009/0026434 A1 | 1/2009 | Malhotra et al. |
| 2009/0039332 A1 | 2/2009 | Lee et al. |
| 2009/0085154 A1 | 4/2009 | Herner et al. |
| 2009/0086521 A1* | 4/2009 | Herner ............... G11C 11/5685 365/63 |
| 2009/0101965 A1 | 4/2009 | Chen et al. |
| 2009/0168492 A1 | 7/2009 | Thorp et al. |
| 2009/0227067 A1 | 9/2009 | Kumar et al. |
| 2009/0256130 A1 | 10/2009 | Schricker |
| 2009/0257270 A1 | 10/2009 | Schricker et al. |
| 2009/0272959 A1 | 11/2009 | Phatak et al. |
| 2009/0272961 A1 | 11/2009 | Miller et al. |
| 2009/0272962 A1 | 11/2009 | Kumar et al. |
| 2009/0283736 A1 | 11/2009 | Kanzawa et al. |
| 2010/0072451 A1 | 3/2010 | Terao et al. |
| 2010/0085794 A1 | 4/2010 | Chen et al. |
| 2010/0265750 A1 | 10/2010 | Yan et al. |
| 2011/0002154 A1 | 1/2011 | Mitani et al. |
| 2011/0037043 A1 | 2/2011 | Wada |
| 2011/0062557 A1 | 3/2011 | Bandyopadhyay et al. |
| 2011/0069532 A1 | 3/2011 | Ichihara et al. |
| 2011/0085370 A1 | 4/2011 | Chen et al. |
| 2011/0140762 A1 | 6/2011 | Jiang et al. |
| 2011/0149634 A1 | 6/2011 | Schloss et al. |
| 2011/0310653 A1 | 12/2011 | Kreupl |
| 2011/0310654 A1 | 12/2011 | Kreupl |
| 2011/0310655 A1 | 12/2011 | Kreupl |
| 2011/0310656 A1 | 12/2011 | Kreupl |
| 2012/0018695 A1 | 1/2012 | Lee et al. |
| 2012/0025164 A1 | 2/2012 | Deweerd et al. |
| 2012/0091419 A1 | 4/2012 | Chen et al. |
| 2012/0091427 A1 | 4/2012 | Chen et al. |
| 2012/0170353 A1 | 7/2012 | Iijima et al. |
| 2012/0193600 A1 | 8/2012 | Himeno et al. |
| 2012/0295413 A1 | 11/2012 | Fujii et al. |
| 2012/0313063 A1 | 12/2012 | Wang et al. |
| 2012/0313069 A1 | 12/2012 | Wang et al. |
| 2013/0026438 A1 | 1/2013 | Wang et al. |
| 2013/0028003 A1 | 1/2013 | Wang et al. |
| 2013/0056700 A1 | 3/2013 | Wang et al. |
| 2013/0065377 A1 | 3/2013 | Gopal et al. |
| 2013/0140512 A1 | 6/2013 | Chen et al. |
| 2013/0140514 A1 | 6/2013 | Mikawa et al. |

OTHER PUBLICATIONS

Office Action dated Apr. 24, 2014 in U.S. Appl. No. 14/183,816.
Response to Final Office Action filed Apr. 25, 2014 in U.S. Appl. No. 13/314,580.
Notice of Allowance and Fees Due dated May 2, 2014 in U.S. Appl. No. 13/399,530.
Advisory Action dated May 12, 2014 in U.S. Appl. No. 13/314,580.
Office Action dated Jun. 4, 2014 in U.S. Appl. No. 14/133,107.
Office Action dated Jun. 25, 2014 in U.S. Appl. No. 14/075,036.
Response to Office Action filed Jul. 2, 2014 in U.S. Appl. No. 14/176,882.
Notice of Allowance and Fees Due dated Jul. 24, 2014 in U.S. Appl. No. 14/176,882.
Response to Office Action filed Jul. 22, 2014 in U.S. Appl. No. 14/183,816.
Notice of Allowance and Fees Due dated Jul. 24, 2014 in U.S. Appl. No. 13/399,530.
International Search Report and Written Opinion dated Jul. 3, 2014 in International Patent Application No. PCT/US2014/018123.
Nardi, F. et al., "Control of Filament Size and Reduction of Reset Current Below 10 uA in NiO Resistance Switching Memories," Academia—Politecnico di Milano; Solid-State Electronics 58, 2011 pp. 42-47.
Tirano, S. et al., "Accurate Analysis of Parasitic Current Overshoot During Forming Operation in RRAMs," CEA-LETI, France; Microelectronic Engineering 88, 2011, pp. 1129-1132.
Hierber, K., "Amorphous Chromium-Silicon: A Material for Kilo-Ohm Sheet Resistances," Siemens Aktiengesellschaft, Thin Solid Films, 57 (1979), pp. 353-357.
Wang, J. et al., "Thin Film Embedded Resistors," Gould Electronics, 6 pages.
Chen, C. et al., "Nitrogen Implanted Polysilicon Resistor for High-Voltage CMOS Technology Application," Academia—National Cheng Kung University, Taiwan; IEEE Electron Device Letters vol. 22, No. 11; Nov. 2011, pp. 524-526.
Chen, A., "Current Overshoot During Set and Reset Operations of Resistive Switching Memories," IEEE; 2012, pp. MY2.1-MY2.4.
Nardi, F. et al., "Reset Current Reduction and Set-Reset Instabilities in Unipolar NiO RRAM," IEEE, 2011, 4 pages.
Communication pursuant to Rules 161(2) and 162 EPC dated Aug. 6, 2014 in European Patent Application No. 112853845.1.
U.S. Appl. No. 14/458,295, filed Aug. 13, 2014.
Response to Office Action filed Sep. 4, 2014 in U.S. Appl. No. 14/133,107.
Final Office Action dated Oct. 24, 2013 in U.S. Appl. No. 13/465,263.
Response to Office Action filed Oct. 28, 2013 in U.S. Appl. No. 13/399,530.
U.S. Appl. No. 14/075,036, filed Nov. 8, 2013.
Notice of Allowance and Fees Due dated Nov. 20, 2013 in U.S. Appl. No. 13/354,006.
Notice of Allowance and Fees Due dated Nov. 1, 2013 in U.S. Appl. No. 13/353,000.
Notice of Allowance and Fees Due dated Nov. 4, 2013 in U.S. Appl. No. 13/399,815.
Notice of Allowance and Fees Due dated Oct. 8, 2014 in U.S. Appl. No. 14/075,036.
Final Office Action dated Oct. 29, 2014 in U.S. Appl. No. 14/133,107.
Tendulkar et al., U.S. Appl. No. 13/354,006, filed Jan. 19, 2012.
Tendulkar et al., U.S. Appl. No. 13/399,815, filed Feb. 17, 2012.
Meyer, R., et al., "Oxide Dual-Layer Memory Element for Scalable Non-Volatile Cross-Point Memory, Technology", 9th Annual, Non-Volatile Memory Technology Symposium, Nov. 11-14, 2008, pp. 54-58.
L.M. Levinson, "Electronic Ceramics: Properties, Devices, and Applications," (1988), p. 293.
Phatak et al., U.S. Appl. No. 13/189,065, filed Oct. 6, 2011.
Guo, X. et al., "Tunneling Leakage Current in Oxynitride: Dependence on Oxygen/Nitrogen Content," Yale University (New Haven, CT); IEEE Electron Device Letters vol. 19, No. 6, Jun. 1998, pp. 207-209.
Muller et al., "Device Electronics for Integrated Circuits, Second Edition", John Wiley & Sons, Inc., (1986), 192-200.
Li et al., Evaluation of SiO2 Antifuse in a 3D-OTP Memory, IEEE Transactions on Device and Materials Reliability, vol. 4, No. 3, Sep. 2004, pp. 416-421.
Herner et al., "Vertical p-i-n Polysilicon Diode with Antifuse for Stackable Field-Programmable ROM," IEEE Electron Device Letters, vol. 25, No. 5, May 2004.
Herner et al., "Polycrystalline silicon/CoSi2 Schottky diode with integrated SiO2 antifuse: a nonvolatile memory cell," Applied Physics Letters, vol. 82, No. 23, 2004.

(56) References Cited

OTHER PUBLICATIONS

McPherson et al., "Proposed Universal Relationship Between Dielectric Breakdown and Dielectric Constant," IEEE International Electron Devices Meeting, 2002, pp. 26.6.1-26.6.4.
McPherson et al., "Trends in the Ultimate Breakdown Strength of High Dielectric-Constant Materials," IEEE Transactions on Electron Devices, vol. 50, No. 8, (Aug. 2003), 1771-1778.
Abhijit Bandyopadhyay, et al., U.S. Appl. No. 13/315,580, filed Dec. 8, 2011.
King et al., "Punchthrough Diode as the Transient Voltage Suppressor for Low-Voltage Electronics," Nov. 1, 1996, 4 pages, vol. 43, No. 11, IEEE Transactions on Electron Devices, IEEE Service Center, Pisacataway, NJ, USA.
Chen et al., U.S. Appl. No. 13/465,263, filed May 7, 2012 .
Herner et al., "Vertical p-i-n Polysilicon Memory Switching: Electrothermal-Induced Order," IEEE Trans. Electron Devices, 53.9, pp. 2320-2327, Sep. 2006.
Final Office Action dated Aug. 29, 2013 in U.S. Appl. No. 13/399,530.
Notice of Allowance and Fees Due dated Aug. 5, 2013 in U.S. Appl. No. 13/399,815.
Notice of Allowance and Fees Due dated Sep. 4, 2013 in U.S. Appl. No. 13/309,813.
Notice of Allowance and Fees Due dated Sep. 16, 2013 in U.S. Appl. No. 13/354,006.
Office Action dated Sep. 12, 2013 in U.S. Appl. No. 13/314,580.
Notice of Allowance and Fees Due dated Sep. 19, 2014 in U.S. Appl. No. 14/183,816.
Response to Office Action filed Sep. 24, 2014 in U.S. Appl. No. 14/075,036.
Notice of Allowance and Fees Due dated Oct. 8, 2013 in U.S. Appl. No. 13/309,813.
Notice of Allowance and Fees Due dated Oct. 17, 2013 in U.S. Appl. No. 13/223,950.
Office Action dated Feb. 27, 2014 in U.S. Appl. No. 13/465,263.
Final Office Action dated Mar. 6, 2014 in U.S. Appl. No. 13/314,580.
U.S. Appl. No. 14/133,107, filed Dec. 18, 2013.
Restriction Requirement dated Jan. 16, 2014 in U.S. Appl. No. 13/228,744.
Response to Restriction Requirement filed Jan. 28, 2014 in U.S. Appl. No. 13/228,744.
Response to Office Action filed Jan. 24, 2014 in U.S. Appl. No. 13/465,263.
U.S. Appl. No. 14/176/882, filed Feb. 10, 2014.
U.S. Appl. No. 14/183,816, filed Feb. 19, 2014.
Office Action dated Feb. 21, 2014 in U.S. Appl. No. 13/228,744.
Notice of Allowance and Fees Due dated Jan. 22, 2015 in U.S. Appl. No. 14/186,726.
Response to Office Action filed Dec. 12, 2013 in U.S. Appl. No. 13/314,580.
Response to Election/Restriction filed Dec. 16, 2014 in U.S. Appl. No. 13/780,089.
Requirement for Restriction/Election mailed Nov. 14, 2014 in U.S. Appl. No. 13/780,089.
Non-Final Rejection mailed Mar. 23, 2015 in U.S. Appl. No. 13/780,089.
Requirement for Restriction/Election mailed May 14, 2015 in U.S. Appl. No. 14/458,295.
Response to Election/Restriction filed Jul. 13, 2015 in U.S. Appl. No. 14/458,295.
Office Action dated Jul. 23, 2015 in U.S. Appl. No. 14/458,295.
European Search Report dated Jun. 2, 2015 in European Patent Application No. 12853845.1.
Communication pursuant to Rules 70(2) and 70a(2) EPC dated Jun. 19, 2015 in European Patent Application No. 12853845.1.
International Preliminary Report on Patentability dated Sep. 1, 2015 in International Application No. PCT/US2014/018123.
Response to Office Action filed Oct. 23, 2015 in U.S. Appl. No. 14/458,295.
Office Action dated Oct. 6, 2015 in U.S. Appl. No. 14/625,867.
Response to Office Action filed Nov. 4, 2015 in U.S. Appl. No. 14/625,867.
Final Office Action dated Jan. 29, 2016 in U.S. Appl. No. 14/458,295.
Notice of Allowance and Fee(s) Due dated Jan. 15, 2016 in U.S. Appl. No. 14/625,867.

* cited by examiner

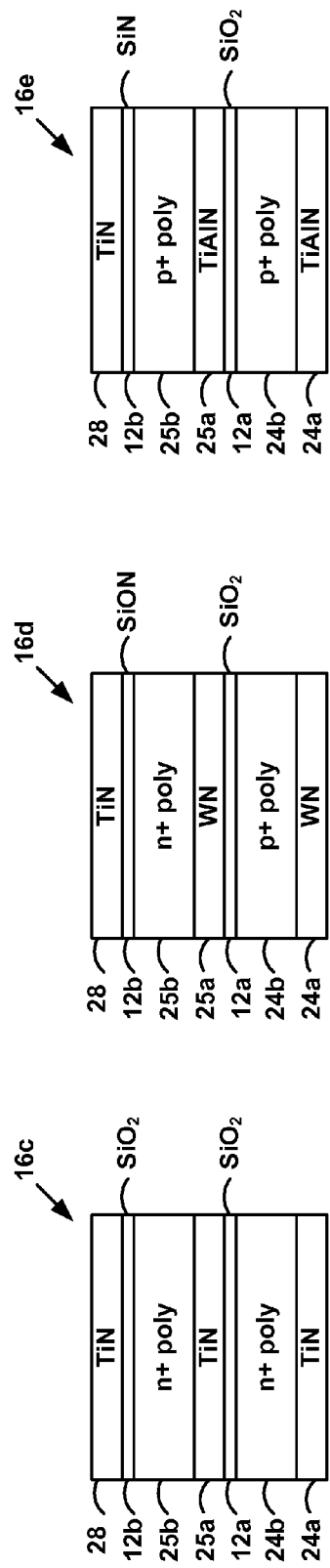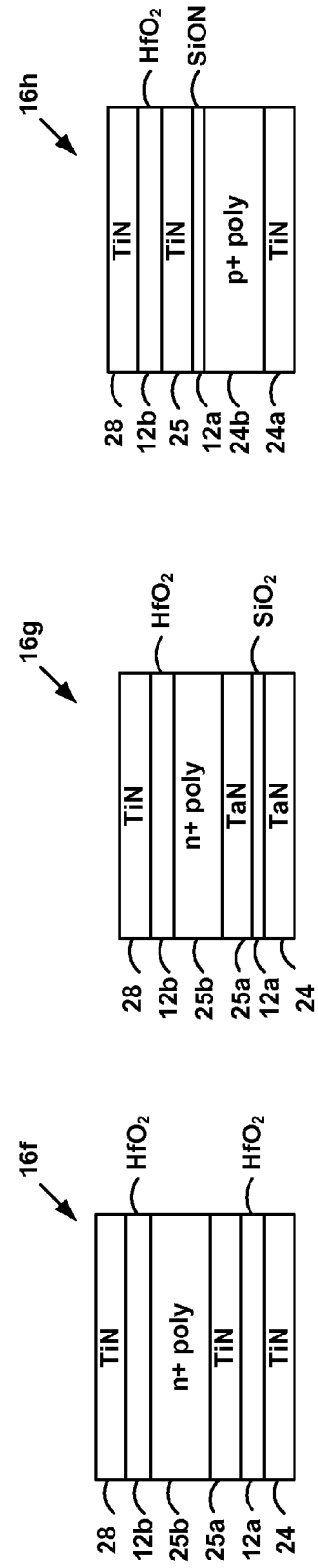

| Memory State | Programming Pulse | Read Current |
|---|---|---|
| 1st | No pulse | $I_A$ |
| 2nd | Pulse P1 with current limit $I_{l1}$ | $I_B$ |
| 3rd | Pulse P2 with current limit $I_{l2} < I_{l1}$ | $I_C$ |
| 4th | Pulse P3 without current limit | $I_D$ |

DIELECTRIC-BASED MEMORY CELLS HAVING MULTI-LEVEL ONE-TIME PROGRAMMABLE AND BI-LEVEL REWRITEABLE OPERATING MODES AND METHODS OF FORMING THE SAME

PRIORITY CLAIM

This application is a divisional of U.S. patent application Ser. No. 13/780,089, filed Feb. 28, 2013, now pending.

BACKGROUND

This invention relates to non-volatile memories, and more particularly to dielectric-based memory cells having multi-level one-time programmable and bi-level rewriteable operating modes and methods of forming the same.

Non-volatile memory cells that include a diode and dielectric memory element in series ("diode-dielectric memory cells") are known. For example, Johnson et al. U.S. Pat. No. 6,034,882, which is incorporated by reference in its entirety for all purposes, describes a memory cell that includes a diode in series with a dielectric rupture antifuse. In general, previously known diode-dielectric memory cells have two memory states (e.g., the dielectric rupture antifuse is either intact or broken down), and are one-time programmable.

It would be advantageous to devise a rewriteable dielectric-based memory cell having multi-level one-time programmable and bi-level rewriteable operating modes.

SUMMARY

In a first aspect of the invention, a memory cell is provided that includes a steering element and a memory element. The memory element includes a first conductive material layer, a first dielectric material layer disposed above the first conductive material layer, a second conductive material layer disposed above the first dielectric material layer, a second dielectric material layer disposed above the second conductive material layer, and a third conductive material layer disposed above the second dielectric material layer. One or both of the first conductive material layer and the second conductive material layer comprise a stack of a metal material layer and a highly doped semiconductor material layer.

In a second aspect of the invention, a method of programming a memory cell is provided. The memory cell includes a memory element having a first conductive material layer, a first dielectric material layer disposed above the first conductive material layer, a second conductive material layer disposed above the first dielectric material layer, a second dielectric material layer disposed above the second conductive material layer, and a third conductive material layer disposed above the second dielectric material layer. One or both of the first conductive material layer and the second conductive material layer comprises a stack of a metal material layer and a highly doped semiconductor material layer. The memory cell has a first memory state upon fabrication corresponding to a first read current. The method includes applying a first programming pulse to the memory cell with a first current limit. The first programming pulse programs the memory cell to a second memory state that corresponds to a second read current greater than the first read current.

In a third aspect of the invention, a method of programming a memory cell is provided. The memory cell includes a memory element having a first conductive material layer, a first dielectric material layer disposed above the first conductive material layer, a second conductive material layer disposed above the first dielectric material layer, a second dielectric material layer disposed above the second conductive material layer, and a third conductive material layer disposed above the second dielectric material layer. One or both of the first conductive material layer and the second conductive material layer comprises a stack of a metal material layer and a highly doped semiconductor material layer. The method includes applying voltage pulses to the memory cell to reversibly switch the memory element between a low-resistivity state and a high-resistivity state.

In a fourth aspect of the invention, a monolithic three-dimensional memory array is provided that includes a first memory level monolithically formed above a substrate, and a second memory level monolithically formed above the first memory level. The first memory level includes a plurality of memory cells, wherein each memory cell includes a steering element and a memory element. The memory element includes a first conductive material layer, a first dielectric material layer disposed above the first conductive material layer, a second conductive material layer disposed above the first dielectric material layer, a second dielectric material layer disposed above the second conductive material layer, and a third conductive material layer disposed above the second dielectric material layer. One or both of the first conductive material layer and the second conductive material layer comprise a stack of a metal material layer and a highly doped semiconductor material layer.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which:

FIGS. 3B-3H are cross-sectional views of example memory elements in accordance with this invention;

DETAILED DESCRIPTION

Figure 1:
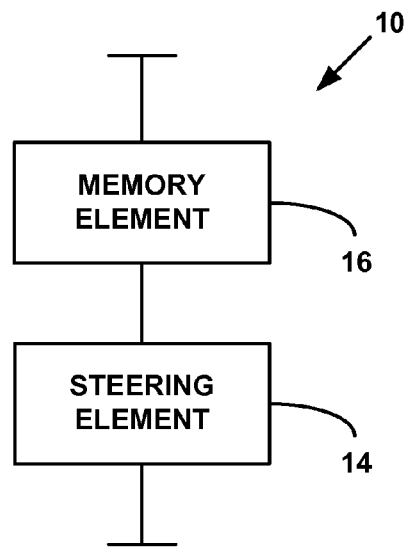
FIG. 1 is a diagram of an example memory cell in accordance with this invention.

A previously known diode-dielectric memory cell includes a dielectric antifuse in series with a diode, such as a vertical polysilicon diode. As formed, a dielectric antifuse is in an initial high-resistance state. Accordingly, if a read voltage is applied across such a memory cell, little or no current flows through the device. If a larger programming voltage is applied across the device, the dielectric antifuse breaks down, and a low-resistance rupture region forms through the dielectric antifuse. As a result, if a read voltage is applied across a programmed memory cell, substantially more current flows through the device.

The difference in current between an unprogrammed memory cell having an intact antifuse and a programmed memory cell having a broken down antifuse can correspond to two different data states of the memory cell. In addition, such previously known dielectric antifuse memory cells typically are one-time programmable memory cells. That is, once a programming voltage has been applied across the device to break down the dielectric antifuse, the memory cell may not subsequently be re-programmed.

Some researchers have attempted to develop "multi-level" dielectric antifuse memory cells that can store more than two data states. For example, Yeh et al. U.S. Patent Publication No. 2006/0073642 ("Yeh") describes a memory cell that includes an "ultra-thin" layer of a dielectric film disposed between first and second electrodes. Yeh asserts that the memory cell can store multiple data states by applying low voltages across the dielectric material layer for intervals of time to cause progressive breakdown of the dielectric material layer, by which a programmable resistance is established representing stored data. Yeh provides only one detailed example of "ultra-thin" dielectric films: oxides, such as oxynitride, having a thickness less than 20 Angstroms, and more preferably about 15 Angstroms or less.

Such previously known multi-level dielectric antifuse memory cells have numerous problems that make such devices unsuitable for use in commercial memory devices. In particular, as dielectric material starts to break down, the resistance of the material decreases. As a result, capacitive discharge from stray capacitance near the memory cell can cause undesirable current surges through the dielectric material, making it difficult to control the progressive breakdown process. This phenomenon can occur even if an external current limiter is used to drive the memory cell. Further, for ultra-thin dielectric materials, such as those described in Yeh, electron tunneling may be significant, which makes control of the progressive breakdown process even more difficult.

As a result of such problems, some previously known multi-level antifuse memory cells have difficulty obtaining repeatable data states. For example, in some previously known progressive breakdown antifuse memory cells, one or more data states may exhibit unacceptably wide variation and/or state jump from a lower data state to higher data states.

Memory cells in accordance with this invention may avoid controllability problems associated with previously known multi-level dielectric antifuse memory cells. In particular, memory cells in accordance with this invention include a memory element 16 that includes a first dielectric material layer disposed above a first conductive material layer, a second conductive material layer disposed above the first dielectric material layer, and a second dielectric material layer disposed above the second conductive material layer. One or both of the first conductive material layer and the second conductive material layer includes a stack of a metal material layer and a highly doped semiconductor material layer.

As described in more detail below, example memory cells in accordance with this invention may be used in a first operating mode as multi-level one-time programmable memory cells that provide at least four substantially distinct data states. In addition, as described in more detail below, example memory cells in accordance with this invention alternatively may be operated in a second operating mode as bi-level rewriteable memory cells.

Example Inventive Memory Cell

FIG. 1 is a diagram of an example memory cell 10 in accordance with this invention. Memory cell 10 includes a memory element 16 coupled to a steering element 14. As described in more detail below, memory element 16 includes multiple layers of dielectric material stacked on one another (not separately shown in FIG. 1). In addition, as described in more detail below, memory cell 10 may be used either in a first operating mode, in which memory cell 10 may be operated as a multi-level one-time programmable memory cell, or in a second operating mode, in which memory cell 10 may be operated as a bi-level rewritable memory cell.

In the first operating mode, the conductivity of memory element 16 has more than two stable values that can be sensed as more than two data states. For example, memory element 16 may have a first conductivity upon fabrication, in which a first read current flows through memory cell 10 upon application of a read voltage. The first conductivity of memory element 16 corresponds to a first memory state (e.g., binary "00") of memory cell 10.

Upon application of a first programming voltage across memory cell 10 while limiting current through memory cell 10 to a first current limit, memory element 16 switches to a second conductivity, in which a second read current (higher than the first read current) flows through memory cell 10 upon application of the read voltage. The second conductivity of memory element 16 corresponds to a second memory state (e.g., binary "01") of memory cell 10. Without wanting to be bound by any particular theory, it is believed that in the second memory state, memory element 16 conducts tunneling leakage current as a conductive path forms through the dielectric stack due to partial or soft breakdown of one of the dielectric material layers (e.g., the thinner dielectric material layer may leak through, and soft breakdown may take place for the thicker dielectric material layer).

Upon application of a second programming voltage across memory cell 10 while limiting current through memory cell 10 to a second current limit greater than the first current limit, memory element 16 switches to a third conductivity, in which a third read current (higher than the second read current) flows through memory cell 10 upon application of the read voltage. The third conductivity of memory element 16 corresponds to a third memory state (e.g., binary "10") of memory cell 10. Without wanting to be bound by any particular theory, it is believed that in the third memory state a stronger conductive path forms through the thicker dielectric material layer, the thinner dielectric material layer leaks through, the overall stack resistance decreases and a higher current state is achieved.

Upon application of a third programming voltage across memory cell 10 without limiting current through memory cell 10, memory element 16 switches to a fourth conductivity, in which a fourth read current (higher than the third read current) flows through memory cell 10 upon application of the read voltage. The fourth conductivity of memory element 16 corresponds to a fourth memory state (e.g., binary "11") of memory cell 10. Without wanting to be bound by any particular theory, it is believed that in the fourth memory state, memory element 16 exhibits substantially complete dielectric breakdown.

In the second operating mode, memory element 16 may be used as a bi-level rewriteable memory element. In particular, memory element 16 may be reversibly switched between a low-resistivity state and a high-resistivity state. The low-resistivity state may represent a first memory state (e.g., binary "1"), and the high-resistivity state may represent a second memory state (e.g., binary "0"). Without wanting to be bound by any particular theory, it is believed that the thicker of the first and second dielectric material layers exhibits resistance switching, and the thinner dielectric material layer exhibits leakage and acts like a local/embedded resistor that modulates the total current flow through the stack.

In an example embodiment, the process of switching memory element 16 from the high-resistivity state to the low-resistivity state is referred to as setting or forming, and the process of switching memory element 16 from the low-resistivity state to the high-resistivity state is referred to as resetting. In other embodiments, setting and resetting and/or data encoding can be reversed. The set or reset process can be performed to program a memory cell to a desired state to represent binary data.

Steering element 14 may include a thin film transistor, a diode, a metal-insulator-metal tunneling current device, or another similar steering element that exhibits non-ohmic conduction by selectively limiting the voltage across and/or the current flow through multi-layer antifuse structure 12. In this manner, memory cell 10 may be used as part of a two or three dimensional memory array and data may be written to and/or read from memory cell 10 without affecting the state of other memory cells in the array.

Example embodiments of memory cell 10, memory element 16 and steering element 14 are described below with reference to FIGS. 2A-2D and FIGS. 3A-3B.

Example Embodiments of Memory Cells and Memory Arrays

Figure 2A:
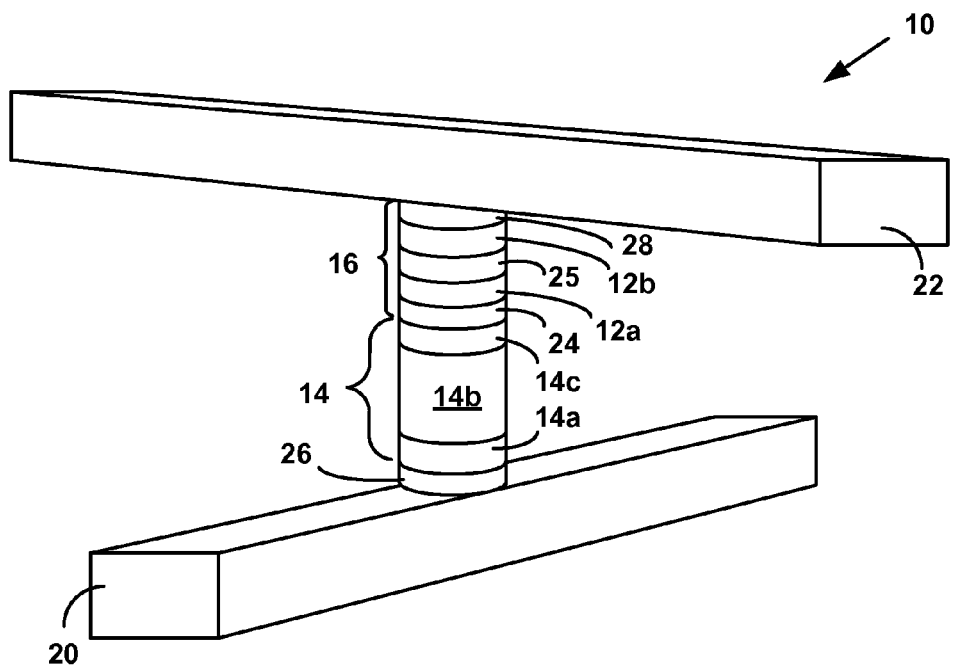
FIG. 2A is a simplified perspective view of an example memory cell in accordance with this invention.

FIG. 2A is a simplified perspective view of an example memory cell 10 in accordance with this invention that includes steering element 14 and memory element 16. Memory element 16 is coupled in series with steering element 14 between a first conductor 20 and a second conductor 22. In some embodiments, a barrier layer 26 may be formed between steering element 14 and first conductor 20. Barrier layer 26 may include titanium ("Ti"), titanium nitride ("TiN"), tantalum ("Ta"), tantalum nitride ("TaN"), tungsten ("W"), tungsten nitride ("WN"), molybdenum ("Mo") or another similar material.

Memory element 16 includes a first conductive material layer 24, a first dielectric material layer 12a disposed above first conductive material layer 24, a second conductive material layer 25 disposed above first dielectric material layer 12a, a second dielectric material layer 12b disposed above second conductive material layer 25, and a third conductive material layer 28 disposed above second dielectric material layer 12b. As described in more detail below, one or both of first conductive material layer 24 and second conductive material layer 25 includes a stack of a metal material layer and a highly doped semiconductor material layer (not separately shown in FIG. 2A).

First conductive material layer 24 forms a bottom electrode, second conductive material layer 25 forms an intermediate electrode, and second conductive material layer 28 forms a top electrode of memory element 16. For simplicity, first conductive material layer 24, second conductive material layer 25, and third conductive material layer 28 will be referred to in the remaining discussion as "bottom electrode 24," "intermediate electrode 25," and "top electrode 28," respectively. In some embodiments, memory element 16 may be positioned below steering element 14.

As discussed above, steering element 14 may include a thin film transistor, a diode, a metal-insulator-metal tunneling current device, or another similar steering element that exhibits non-ohmic conduction by selectively limiting the voltage across and/or the current flow through multi-layer antifuse structure 12. In the example of FIG. 2A, steering element 14 is a diode. Accordingly, steering element 14 is sometimes referred to herein as "diode 14."

Diode 14 may include any suitable diode such as a vertical polycrystalline p-n, p-i-n, n-p-n or p-n-p punch-through diode, a carbon diode, or other similar diode, whether upward pointing with an n-region above a p-region of the diode or downward pointing with a p-region above an n-region of the diode. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed. Example embodiments of diode 14 are described below with reference to FIG. 3A. Example carbon diodes and methods of forming carbon diodes are described in Bandyopadhyay et al. U.S. patent application Ser. No. 12/639,840, filed Dec. 16, 2009 ("the '840 application"), which is incorporated by reference herein in its entirety for all purposes.

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first conductor 20 and/or second conductor 22 to improve device performance and/or aid in device fabrication.

Figure 2B:
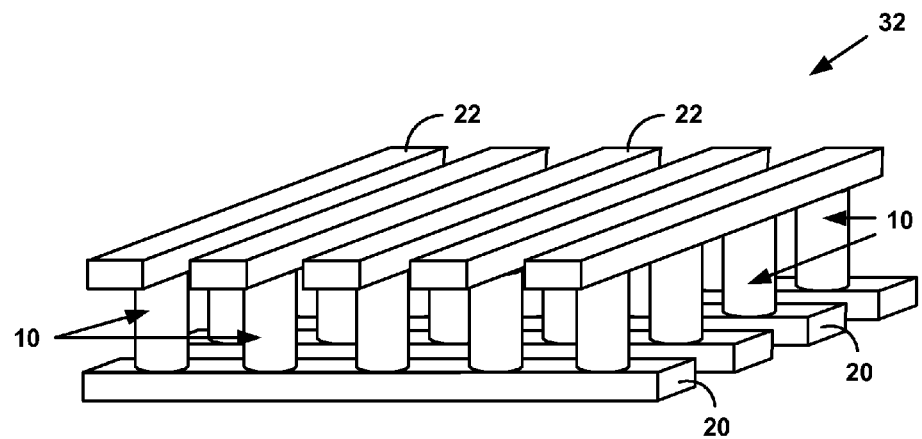
FIG. 2B is a simplified perspective view of a portion of a first example memory level formed from a plurality of the memory cells of FIG. 2A.

FIG. 2B is a simplified perspective view of a portion of a first memory level 32 formed from a plurality of memory cells 10, such as memory cell 10 of FIG. 2A. For simplicity, memory element 16, diode 14, and barrier layer 26 are not separately shown. Memory level 32 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
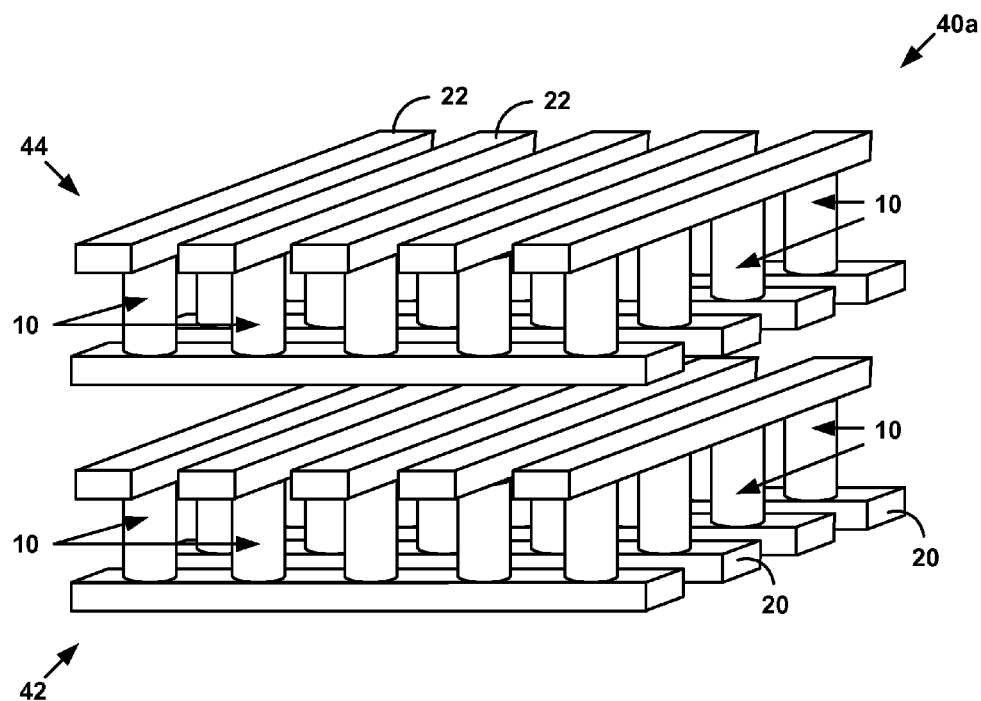
FIG. 2C is a simplified perspective view of a portion of a first example three-dimensional memory array in accordance with this invention.

For example, FIG. 2C is a simplified perspective view of a portion of a monolithic three dimensional array 40a that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between the first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

In some embodiments, the memory levels may be formed as described in U.S. Pat. No. 6,952,030, titled "High-Density Three-Dimensional Memory Cell," which is hereby incorporated by reference herein in its entirety for all purposes. For instance, the upper conductors of a first memory level may be used as the lower conductors of a second memory level that is positioned above the first memory level as shown in the alternative example three dimensional memory array 40b illustrated in FIG. 2D.

In such embodiments, the diodes on adjacent memory levels preferably point in opposite directions as described in U.S. patent application Ser. No. 11/692,151, filed Mar. 27, 2007, and titled "Large Array Of Upward Pointing P-I-N Diodes Having Large And Uniform Current" (hereinafter "the '151 Application"), which is hereby incorporated by reference herein in its entirety for all purposes.

Figure 2D:
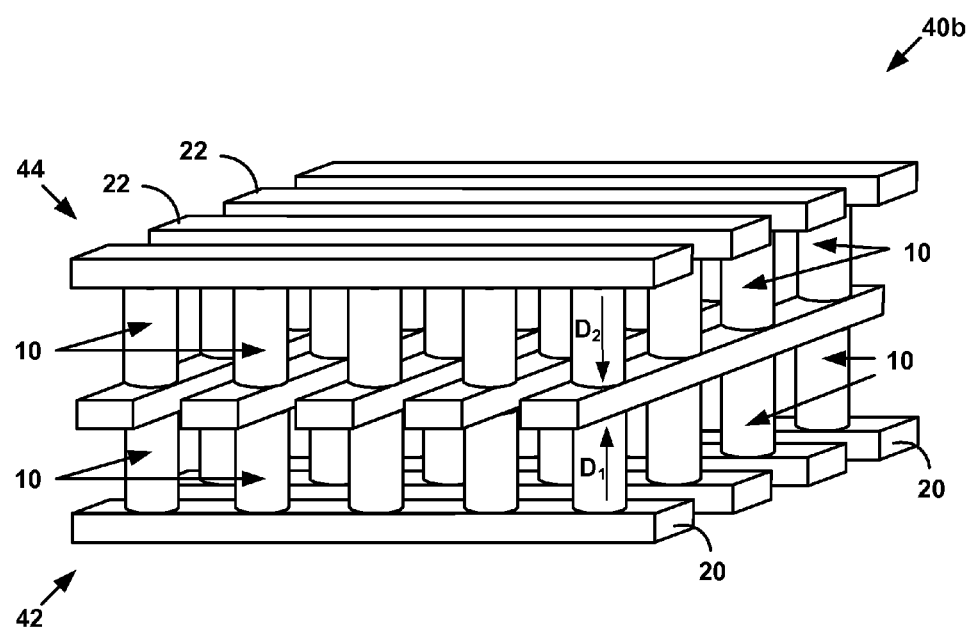
FIG. 2D is a simplified perspective view of a portion of a second example three-dimensional memory array in accordance with this invention.

For example, as shown in FIG. 2D, the diodes of the first memory level 42 may be upward pointing diodes as indicated by arrow D1 (e.g., with p regions at the bottom of the diodes), whereas the diodes of the second memory level 44 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
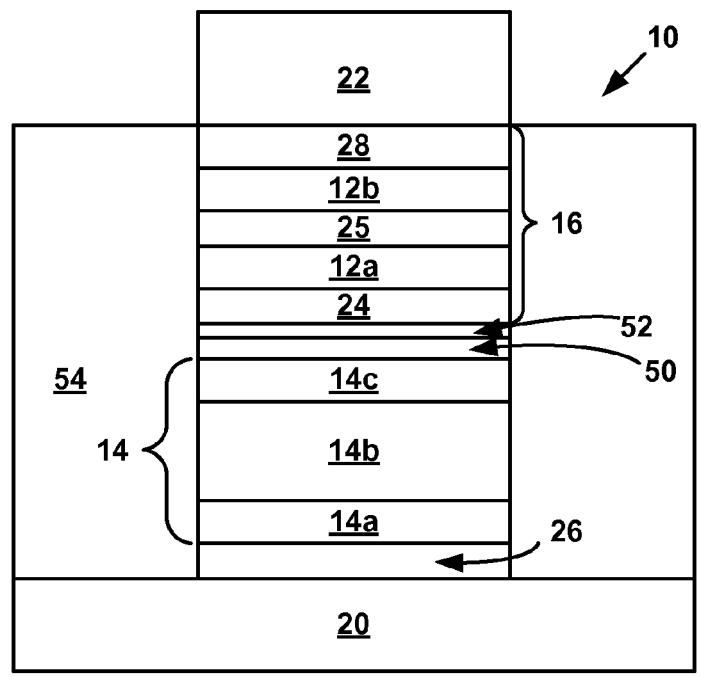
FIG. 3A is a cross-sectional view of an example memory cell in accordance with this invention.

FIG. 3A is a cross-sectional view of an example embodiment of memory cell 10 of FIG. 1. In particular, FIG. 3A shows an example memory cell 10 which includes diode 14, memory element 16 and first and second conductors 20 and 22, respectively. Memory element 16 includes first dielectric material layer 12a disposed above bottom electrode 24, intermediate electrode 25 disposed above first dielectric material layer 12a, second dielectric material layer 12b disposed above intermediate electrode 25, and top electrode 28 disposed above second dielectric material layer 12b. As described in more detail below, one or both of bottom electrode 24 and intermediate electrode 25 includes a stack of a metal material layer and a highly doped semiconductor material layer.

Memory cell 10 also may include barrier layer 26, a silicide layer 50, a silicide-forming metal layer 52, and dielectric layer 54, as well as adhesion layers, antireflective coating layers and/or the like (not shown) which may be used with first and/or second conductors 20 and 22, respectively, to improve device performance and/or facilitate device fabrication.

Diode 14 may be a vertical p-n, p-i-n, n-p-n or p-n-p punch-through diode, a carbon diode, or other similar diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

In some embodiments, a thin germanium and/or silicon-germanium alloy layer (not shown) may be formed on n+ polysilicon region 14a to prevent and/or reduce dopant migration from n+ polysilicon region 14a into intrinsic region 14b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (hereinafter "the '331 Application"), which is hereby incorporated by reference herein in its entirety for all purposes. In some embodiments, a few hundred angstroms or less of silicon-germanium alloy with about 10 at % or more of germanium may be employed.

Barrier layer 26, such as Ti, TiN, Ta, TaN, W, WN, Mo, etc., may be formed between first conductor 20 and n+ region 14a (e.g., to prevent and/or reduce migration of metal atoms into the polysilicon regions).

If diode 14 is fabricated from deposited silicon (e.g., amorphous or polycrystalline), a silicide layer 50 may be formed on diode 14 to place the deposited silicon in a low resistivity state, as fabricated. Such a low resistivity state allows for easier programming of memory cell 10 as a large voltage is not required to switch the deposited silicon to a low resistivity state.

For example, a silicide-forming metal layer 52 such as titanium or cobalt may be deposited on p+ polysilicon region 14c. During a subsequent anneal step (described below), silicide-forming metal layer 52 and the deposited silicon of diode 14 interact to form silicide layer 50, consuming all or a portion of the silicide-forming metal layer 52. In some embodiments, a nitride layer (not shown) may be formed at a top surface of silicide-forming metal layer 52. For example, if silicide-forming metal layer 52 is titanium, a TiN layer may be formed at a top surface of silicide-forming metal layer 52.

A rapid thermal anneal ("RTA") step may then be performed to form silicide regions by reaction of silicide-forming metal layer 52 with p+ region 14c. The RTA may be performed at about 540-650° C. for about 1 minute, and causes silicide-forming metal layer 52 and the deposited silicon of diode 14 to interact to form silicide layer 50, consuming all or a portion of silicide-forming metal layer 52. An additional, higher temperature anneal (e.g., such as at about 750° C. as described below) may be used to crystallize the diode.

As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of diode 14 during annealing). Lower resistivity silicon thereby is provided. Similar results may be achieved for silicon-germanium alloy and/or germanium diodes.

In embodiments in which a nitride layer was formed at a top surface of silicide-forming metal layer 52, following the RTA step, the nitride layer may be stripped using a wet chemistry. For example, if silicide-forming metal layer 52 includes a TiN top layer, a wet chemistry (e.g., ammonium, peroxide, water in a 1:1:1 ratio) may be used to strip any residual TiN. In some embodiments, the nitride layer formed at a top surface of silicide-forming metal layer 52 may remain, or may not be used at all.

Bottom electrode 24 is formed above silicide-forming metal layer 52. In some embodiments, bottom electrode 24 may have a thickness of about 200 angstroms to about 500 angstroms, more generally between about 100 angstroms to about 1200 angstroms, although other thicknesses may be used. Bottom electrode 24 may be formed by atomic layer deposition ("ALD"), chemical vapor deposition ("CVD"), plasma-enhanced CVD ("PECVD"), physical vapor deposition ("PVD"), sputter deposition from a target, or other similar process.

First dielectric material layer 12a is formed above bottom electrode 24. In some embodiments, first dielectric material layer 12a may have a thickness of about 20 angstroms to about 30 angstroms, more generally between about 10 angstroms to about 50 angstroms, although other thicknesses may be used. First dielectric material layer 12a may be silicon dioxide ("SiO2"), hafnium oxide ("HfO2"), silicon oxynitride ("SiON"), hafnium silicon oxynitride ("HfSiON"), hafnium silicon oxide ("HfSiOx"), hafnium aluminate ("HfAlxOy"), aluminum oxide ("Al2O3"), silicon nitride ("Si3N4"), zirconium dioxide ("ZrO2"), lanthanum oxide ("La2O3"), tantalum pentoxide ("Ta2O5"), titanium dioxide ("TiO2"), strontium titanate ("SrTiO3"), vanadium oxide ("VO2"), vanadium silicon oxide ("VSiO"), or other similar dielectric materials.

First dielectric material layer 12a may be formed over bottom electrode 24 using any suitable formation process, such as ALD, CVD, PECVD, high density plasma CVD ("HDP-CVD"), PVD, metalorganic chemical vapor deposition ("MOCVD"), direct liquid injection MOCVD ("DLI-MOCVD"), rapid thermal oxidation ("RTO"), or slot plan antenna plasma technology ("SPA"). Persons of ordinary skill in the art will understand that other processes may be used to form first dielectric material layer 12a.

Intermediate electrode 25 is formed above first dielectric material layer 12a. In some embodiments, intermediate electrode 25 may have a thickness of about 200 angstroms to about 500 angstroms, more generally between about 100 angstroms to about 1200 angstroms, although other thicknesses may be used. Intermediate electrode 25 may be formed by ALD, CVD, PECVD, PVD, sputter deposition from a target, or other similar process.

Second dielectric material layer 12b is formed above intermediate electrode 25. In some embodiments, second dielectric material layer 12b may have a thickness of about 30 angstroms to about 50 angstroms, more generally between about 20 angstroms to about 60 angstroms, although other thicknesses may be used. Second dielectric material layer 12b may be SiO2, HfO2, SiON, HfSiON, HfSiOx, HfAlxOy Al2O3, Si3N4, ZrO2, La2O3, Ta2O5, TiO2, SrTiO3, VO2, VSiO, or other similar dielectric materials.

Second dielectric material layer 12b may be formed over intermediate electrode 25 using any suitable formation process, such as ALD, CVD, PECVD, HDP-CVD, PVD, RTO, MOCVD, DLI-MOCVD or SPA. Persons of ordinary skill in the art will understand that other processes may be used to form first dielectric material layer 12a.

Top electrode 28 is formed above second dielectric material layer 12b. In some embodiments, top electrode 28 may have a thickness of about 100 angstroms to about 200 angstroms, more generally between about 100 angstroms to about 400 angstroms, although other thicknesses may be used. In some embodiments, top electrode 28 may be Ti, TiN, Ta, TaN, W, WN, Mo, tantalum aluminum nitride ("TaAlN"), vanadium nitride ("VN"), vanadium silicon nitride ("VSi3N4"), zirconium nitride ("ZrN"), zirconium silicon nitride ("ZrSi3N4"), hafnium nitride ("HfN"), hafnium silicon nitride ("HfSi3N4"), titanium silicon nitride ("TiSi3N4"), tantalum silicon nitride ("TaSi3N4"), tungsten silicon nitride ("WSi3N4"), tungsten aluminum nitride ("WAlN"), carbon, a noble metal such as platinum, or another similar material. In an example embodiment in accordance with this invention, top electrode 28 is TiN. Top electrode 28 may be formed by ALD, CVD, PECVD, PVD, sputter deposition, or other similar processes.

Figure 3B:
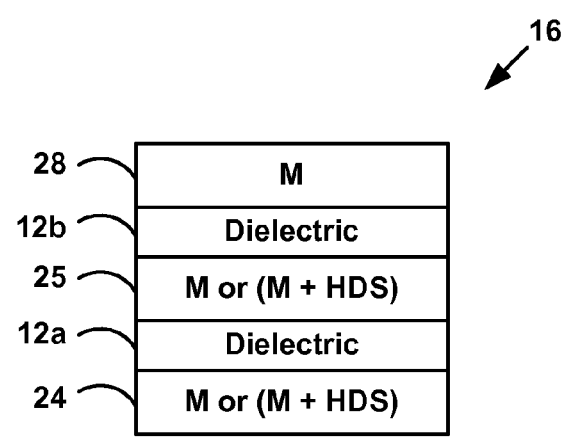

As described above, one or both of bottom electrode 24 and intermediate electrode 25 includes a stack of a metal material layer and a highly doped semiconductor material layer. For example, FIG. 3B illustrates an expanded view of a memory element 16 in accordance with this invention. Bottom electrode 24 may be a metal material layer or a stack of a metal material layer and a highly doped semiconductor material layer. Likewise, intermediate electrode 25 may be a layer of a metal material or a stack of a metal material layer and a highly doped semiconductor material layer. Without wanting to be bound by any particular theory, it is believed that the highly doped semiconductor material in bottom electrode 24 and/or intermediate electrode 25 may act as local resistor with in-situ current limiting, and may limit capacitive discharge through memory element 16 during a programming event to prevent over programming of the cell.

Example metal materials include Ti, TiN, Ta, TaN, W, WN, Mo, TaAlN, VN, VSi3N4, ZrN, ZrSi3N4, HfN, HfSi3N4, TiSi3N4, TaSi3N4, WSi3N4, WAlN, carbon, or other similar metal materials. Example highly doped semiconductor materials include n+ polysilicon having a doping concentration between about $1\times10^{20}$ cm-3 and about $1\times10^{22}$ cm-3 (referred to herein as "n+ poly"), p+ polysilicon having a doping concentration between about $1\times10^{20}$ cm-3 and about $1\times10^{22}$ cm-3 (referred to herein as "p+ poly"), n+ poly with Ge (10-20% Ge), p+ poly with Ge (10-20% Ge), or other similar highly doped semiconductor materials. Persons of ordinary skill in the art will understand that other semiconductor materials, doping types and doping concentrations may be used.

Persons of ordinary skill in the art also will understand that the highly doped semiconductor materials may be uniformly doped or may have a graded or combination of low and high doping profile, which controls the resistance of the electrode. Resistance modulation by doping control impacts the switching endurance of the cell when used in rewriteable mode and also improves the state distinction when one-time programmable mode is invoked.

FIGS. 3C-3J illustrate various example embodiments of memory element 16, in which one or both of bottom electrode 24 and intermediate electrode 25 includes a stack of a metal material layer and a highly doped semiconductor material layer formed on the metal material layer. In particular, bottom electrode 24 may include a metal material layer 24a and a highly doped semiconductor material layer 24b formed on metal material layer 24a, and intermediate electrode 25 may include a metal material layer 25a and a highly doped semiconductor material layer 25b formed on metal material layer 25a. Metal material layers 24a and 25a each may be Ti, TiN, Ta, TaN, W, WN, Mo, TaAlN, VN, VSi3N4, ZrN, ZrSi3N4, HfN, HfSi3N4, TiSi3N4, TaSi3N4, WSi3N4, WAlN, or other similar metal materials. Highly doped semiconductor material layers 24b and 25v each may be n+ poly, p+ poly, n+ poly with Ge (10-20% Ge), p+ poly with Ge (10-20% Ge), or other similar highly doped semiconductor materials.

In FIG. 3C, bottom electrode 24 includes a stack of a metal material layer (TiN) 24a and a highly doped semiconductor material layer n+ poly layer 24b formed on TiN layer 24a. In some embodiments, metal material layer 24a may have a thickness of about 200 angstroms to about 300 angstroms, more generally between about 100 angstroms to about 500 angstroms, and highly doped semiconductor material layer 24b may have a thickness of about 200 angstroms to about 300 angstroms, more generally between about 100 angstroms to about 1000 angstroms. Other thicknesses may be used.

Likewise, intermediate electrode 25 includes a stack of a metal material layer (TiN) 25a and a highly doped semiconductor material layer (n+ poly) 25b formed on TiN layer 25a. In some embodiments, metal material layer 25a may have a thickness of about 200 angstroms to about 300 angstroms, more generally between about 100 angstroms to about 500 angstroms, and highly doped semiconductor material layer 25b may have a thickness of about 200 angstroms to about 300 angstroms, more generally between about 100 angstroms to about 1000 angstroms. Other thicknesses may be used.

In example memory element 16c of FIG. 3C, first dielectric material layer 12a and second dielectric material layer 12b are both SiO2, highly doped semiconductor material layer 24b and highly doped semiconductor material layer 25b are both n+ poly, and metal material layers 24a and 25a are both TiN. Persons of ordinary skill in the art will understand, however, that first dielectric material layer 12a and second dielectric material layer 12b need not be the same material, highly doped semiconductor material layer 24b and highly doped semiconductor material layer 25b need not be the same material, and that metal material layers 24a and 25a need not be the same metal and that other metal materials may be used.

For example, FIG. 3D illustrates an alternative example memory element 16d in which first dielectric material layer 12a is SiO2, second dielectric material layer 12b is SiON, highly doped semiconductor material layer 24b is p+ poly and highly doped semiconductor material layer 25b is n+ poly, and metal material layers 24a and 25a are WN.

In example memory element 16c of FIG. 3C, highly doped semiconductor material layers 24b and 25b are both n+ poly. Persons of ordinary skill in the art will understand, however, that highly doped semiconductor material layers 24b and 25b may include other highly doped semiconductor materials. For example, FIG. 3E illustrates an alternative example memory element 16e in which highly doped semiconductor material layers 24b and 25b are both p+ poly. In this example embodiment, metal material layers 24a and 25a are both TiAlN. Persons of ordinary skill in the art will understand, however, that highly doped semiconductor material layer 24b and highly doped semiconductor material layer 25b need not be the same material, other metal materials may be used, and that metal material layers 24a and 25a need not be the same metal.

In example memory elements 16c, 16d and 16e of FIGS. 3C-3E, bottom electrode 24 and intermediate electrode 25 have each included a stack of a metal material and a highly doped semiconductor material. In example embodiments of this invention, however, one of bottom electrode 24 and intermediate electrode 25 may include a metal material, whereas the other one of bottom electrode 24 and intermediate electrode 25 may include a stack of a metal material layer and a highly doped semiconductor material layer.

For example, FIG. 3F illustrates an example memory element 16f in which bottom electrode 24 is a metal material layer (TiN), and intermediate electrode 25 includes a stack of a metal material layer (TiN) 25a and a highly doped semiconductor material layer (n+ poly) 25b formed on TiN layer 25a.

In example memory element 16f of FIG. 3F, first dielectric material layer 12a and second dielectric material layer 12b are both HfO2, and bottom electrode 24 and intermediate electrode 25 both include TiN. Persons of ordinary skill in the art will understand, however, that first dielectric material layer 12a and second dielectric material layer 12b need not be the same material, and bottom electrode 24 and intermediate electrode 25 need not include the same metal, and may include metals other than TiN.

For example, FIG. 3H illustrates another alternative example memory element 16g in which first dielectric material layer 12a is SiO2, and second dielectric material layer 12b is HfO2, bottom electrode 24 is TaN, and intermediate electrode 25 includes a TaN layer 25a and an n+ poly layer 25b formed on TaN layer 25a.

In example memory elements 16f and 16g of FIGS. 3F-3G, bottom electrode 24 is metal, and intermediate electrode 25 includes a stack of a metal material layer and an n+ poly layer. Persons of ordinary skill in the art will understand, however, that intermediate electrode 25 may be a metal, bottom electrode 24 alternatively may include a stack of a metal material layer and a highly doped semiconductor material layer, and the highly doped semiconductor material may be other than n+ poly.

For example, FIG. 3H illustrates an another example memory element 16h in which bottom electrode 24 includes a stack of a metal material layer (TiN) 24a and a highly doped semiconductor material layer (p+ poly) 24b formed on TiN layer 24a, and intermediate electrode 25 is metal (TiN). In this example embodiment, bottom electrode 24 and intermediate electrode 25 both include TiN. Persons of ordinary skill in the art will understand, however, that other metal materials may be used, and that metal layer 24a and intermediate electrode 25 need not be the same metal.

Figure 3J:
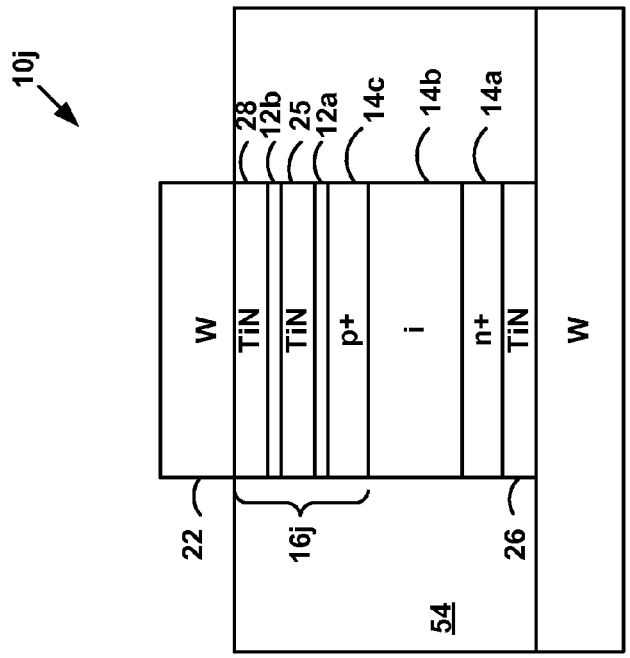
FIGS. 3I-3J are cross-sectional views of alternative example memory cells in accordance with this invention.
Figure 3I:
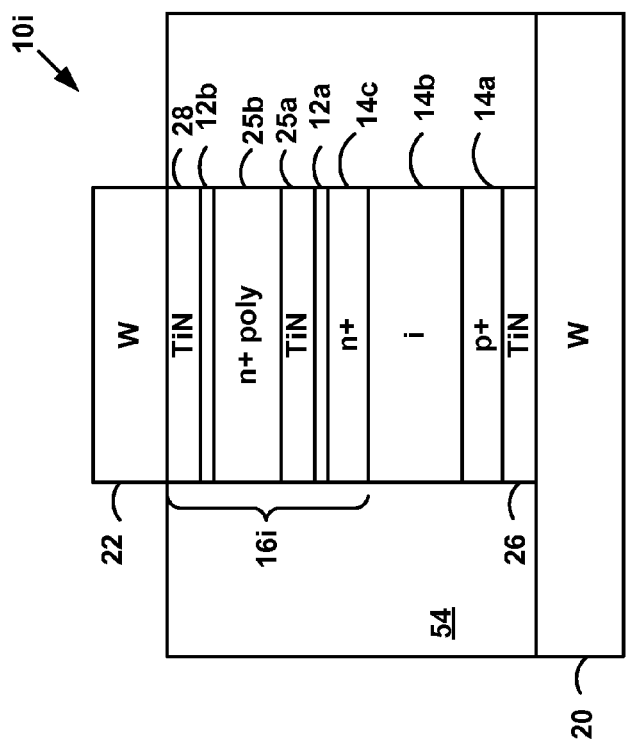

Referring now to FIG. 3I, still another example memory element 16i is described. In this example embodiment, memory element 16i includes n+ polysilicon region 14c. That is, memory element 16i shares n+ polysilicon region 14c with diode 14. In this regard, bottom electrode 24 may be eliminated. Likewise, FIG. 3J illustrates yet another example memory element 16j, which includes p+ polysilicon region 14c shared with diode 14. As in the embodiment of FIG. 3I, bottom electrode 24 may be eliminated.

Referring again to FIG. 3A, second conductor 22 is formed above memory element 16. Second conductor 22 may include one or more barrier layers and/or adhesion layers (not shown) deposited over memory element 16 prior to deposition of a conductive layer used to form second conductors 22. Second conductors may be formed from any suitable conductive material such as tungsten, another suitable metal, heavily doped semiconductor material, a conductive silicide, a conductive silicide-germanide, a conductive germanide, or the like deposited by PVD or any other any suitable method (e.g., CVD, etc.). Other conductive layer materials may be used. The deposited conductive layer and optional barrier and/or adhesion layer may be patterned and etched to form second conductors 22. In at least one embodiment, second conductors 22 are substantially parallel, substantially coplanar conductors that extend in a different direction than first conductors 20.

Programming and Sensing

As described above, memory cells 10 in accordance with this invention may be used either in a first operating mode, in which memory cell 10 may be operated as a multi-level one-time programmable memory cell, or in a second operating mode, in which memory cell 10 may be operated as a bi-level rewritable memory cell. Each of these will be discussed in turn.

Multi-Level One-Time Programmable Memory Operation

Figures 4A, 4B:
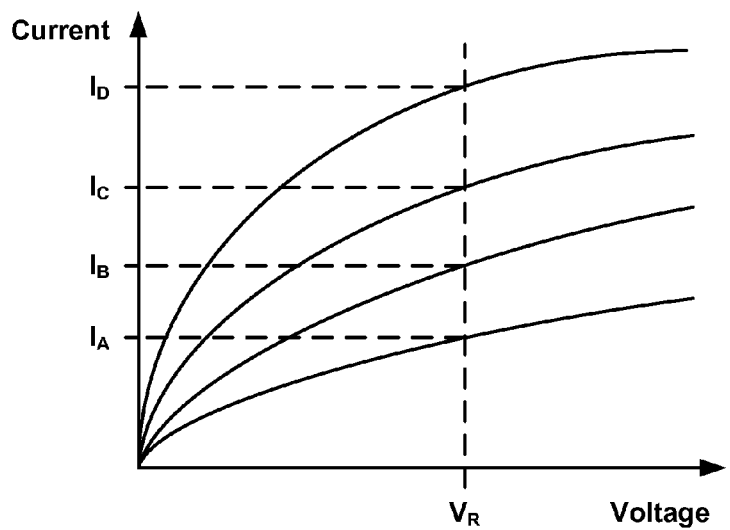
FIG. 4A is a diagram of example I-V characteristics of a memory cell in accordance with this invention.
FIG. 4B is a diagram of example memory states, programming conditions and read currents of a memory cell in accordance with this invention.

Referring to FIGS. 4A and 4B, example current and voltage characteristics of a four-state one-time programmable memory cell in accordance with this invention, such as memory cell 10, are described. Persons of ordinary skill in the art will understand that memory cells in accordance with this invention may have more or less than four data states.

If a read voltage VR is applied across memory cell 10 as formed, a first read current IA flows through the device. Read voltage VR may be about 1V to about 2V, although other voltage values may be used. First read current IA may be about 0.5 nA to about 5 nA, although other current values may be used. First read current IA corresponds to a first data state of memory cell 10.

To program memory cell 10 to a second data state, a first programming pulse P1 having a first programming voltage VP1 is applied across memory cell 10, while limiting current through the device to a first current limit Il1. Current limiting may be obtained using one or more on-chip resistors or using transistor (e.g., FET) control. First current limit Il1 may be between about 1 μA and about 2 μA, although other values may be used. After the pulse, the read current is measured. This process may be iteratively repeated until a second predetermined read current IB flows through memory cell 10 upon application of read voltage VR. The second predetermined read current IB corresponds to a second data state of memory cell 10, and may be about 50 nA to about 200 nA, although other values may be used.

First programming pulse P1 may have a first programming voltage VP1 between about 9V and about 10V, more generally between about 8V and about 13V, may have a pulse width of between about 100 μs and about 150 μs, and may have rise and fall times between about 50 ns and about 200 ns. Other voltage values, pulse widths and/or rise and fall times may be used. Persons of ordinary skill in the art will understand that first programming pulse P1 alternatively may be a current pulse.

To program memory cell 10 to a third data state, a second programming pulse P2 having a second programming voltage VP2 is applied across memory cell 10, while limiting current through the device to a second current limit Il2, and the read current is measured. Second current limit Il2 may be between about 2 A and about 10 A, although other values may be used. This process may be iteratively repeated until a third predetermined read current IC flows through memory cell 10 upon application of read voltage VR. The third predetermined read current IC corresponds to a third data state of memory cell 10, and may be about 0.5 μA to about 1 μA, although other values may be used.

Second programming pulse P2 may have a second programming voltage VP2 between about 8V and about 9.5V, more generally between about 4V and about 11V, may have a pulse width of between about 100 μs and about 150 μs, and may have rise and fall times between about 50 ns and about 200 ns. Other voltage values, pulse widths, rise and fall times and/or current limits may be used. Persons of ordinary skill in the art will understand that second programming pulse P2 alternatively may be a current pulse.

Limiting the current while applying the programming pulse is important to avoid over-programming the memory cell. Current limiting may be achieved through external resistors, on-chip resistors, or other similar techniques. Arrays of memory cells, such as memory cells 10, typically are driven by CMOS logic transistors, which may be used to provide current limiting. In addition, using on-chip resistors, preferably closely located to the memory cells, may be more effective in terms of reducing parasitic capacitive discharge current flowing through the memory cell.

To program memory cell 10 to a fourth data state, a third programming pulse P3 having a third programming voltage VP3 is applied across memory cell 10 without limiting current through the device, and the read current is measured. This process may be iteratively repeated until a fourth predetermined read current ID flows through memory cell 10 upon application of read voltage VR. The fourth predetermined read current ID corresponds to a fourth data state of memory cell 10, and may be about 5 μA to about 20 μA, although other values may be used.

Third programming pulse P3 may have a third programming voltage VP3 between about 10V and about 12V, more generally between about 5V and about 13V, may have a pulse width of about fps to about 100 μs, and may have rise and fall times of about 50 ns to about 200 ns. Other voltage values, pulse widths, and/or rise and fall times may be used. Persons of ordinary skill in the art will understand that third programming pulse P3 alternatively may be a current pulse.

Memory cell 10 thus can be in any one of four possible data states, as summarized in FIG. 4B. The first data state (sometimes referred to as the "virgin state") is the state of memory cell 10 as measured first out of the fab, without any programming pulses having been applied to the device. The second data state is the state of memory cell 10 after first program pulse P1 has been applied to the device, the third data state is the state of memory cell 10 after the second program pulse P2 has been applied to the device, and the fourth data state is the state of memory cell 10 after the third program pulse P3 has been applied to the device. Program pulses P1, P2 and P3 may be applied independently of one another (e.g., third program pulse P3 may be applied to memory cell 10 without first applying program pulses P1 and P2). In addition, persons of ordinary skill in the art will understand that memory cell 10 may be programmed to any memory state (e.g., including intermediate levels, such as 1.5 bits/cell) using appropriate programming conditions.

Memory cell 10 may be read by applying read voltage VR across memory cell 10, and sensing a read current while applying read voltage VR. The sensed read current corresponds to the data state of memory cell 10. The four read current values IA, IB, IC and ID are different from one another so that each unique data state may be sensed.

Persons of ordinary skill in the art will understand that memory cells in accordance with this invention may have more or less than four data states.

Bi-Level Rewriteable Memory Operation

As described above, memory cells 10 in accordance with this invention alternatively may be operated as bi-level rewriteable memory cells, in which the memory cells may be reversibly switched between a low-resistivity state and a high-resistivity state. The low-resistivity state may represent a first memory state (e.g., binary "1"), and the high-resistivity state may represent a second memory state (e.g., binary "0").

To operate a memory cell 10 as rewriteable memory cell, an initial forming step is used so that memory element 16 operates in a current range in which switching can occur. Forming is a critical event in oxide-based resistive-RAM or the like devices. An appropriate forming current level is necessary to achieve proper switching with optimum ON/OFF window. Forming is generally understood to be a soft dielectric breakdown which generates and moves oxygen vacancies to form conductive filaments, which is often explained by time-dependent dielectric breakdown ("TDDB") models.

In the forming step, the initially insulating properties of first dielectric material layer 12a and/or second dielectric material layer 12b are altered, and a conductive current path is formed between top and bottom electrode. This forming step is usually obtained by applying a long pulse with slow rise time, where the pulse voltage is stepped-up slowly to avoid sudden current spikes through the device. This may be especially important for larger array than single-bit. The E-field thus built-up across the dielectric stack creates a percolation path through trap assisted tunneling that leads to increase in current through the stack. Once this current reaches forming verify current level, Iverify, it is sensed and monitored for the forming of the cell. Example forming parameters are set forth in Table 1:

TABLE 1

EXAMPLE FORMING PARAMETERS

| PARAMETER | EXAMPLE RANGE | PREFERRED RANGE |
|---|---|---|
| Pulse Magnitude (V) | 5-12 | 6-9 |
| Pulse Duration (ns) | 1-1000 | 10-100 |
| Pulse Rise Time (ns) | 20-250 | 50-150 |
| $I_{verify}$ (nA) | 50-400 | 100-200 |

Persons of ordinary skill in the art will understand that forming pulses may be current pulses, and that other pulse magnitude, pulse duration, pulse rise time and $I_{verify}$ values may be used.

Following the forming step, voltage (or current) pulses may be applied to the memory cell 10 to switch memory element 16 from the high resistivity state to the low resistivity state. The process of switching memory element 16 from the high-resistivity state to the low-resistivity state is referred to as setting, and the process of switching memory element 16 from the low-resistivity state to the high-resistivity state is referred to as resetting. In other embodiments, setting and resetting and/or the data encoding can be reversed. The set or reset process can be performed for a memory cell to program it to a desired state to represent binary data.

First dielectric material layer 12a and/or second dielectric material layer 12b may exhibit unipolar or bipolar resistance-switching characteristics. The layer responsible for the switching in the present embodiment may be the thicker one. However, apart from the thickness, there are other parameters such as type of material, deposition condition, and interface control that may be considered for the design and fabrication steps of the stack.

With a unipolar resistance-switching characteristic, the voltages used for both set and reset processes are of the same polarity, e.g., either both positive or both negative. In contrast, with a bipolar resistance-switching characteristic, opposite polarity voltages are used for the set and reset processes. Specifically, the voltage used for the set process can be positive whereas the voltage used for the reset process is negative, or the voltage used for the set process can be negative while the voltage used for the reset process is positive. For the present embodiment, forming is always positive and independent of the SET/RESET polarity chosen for switching.

Figure 5A:
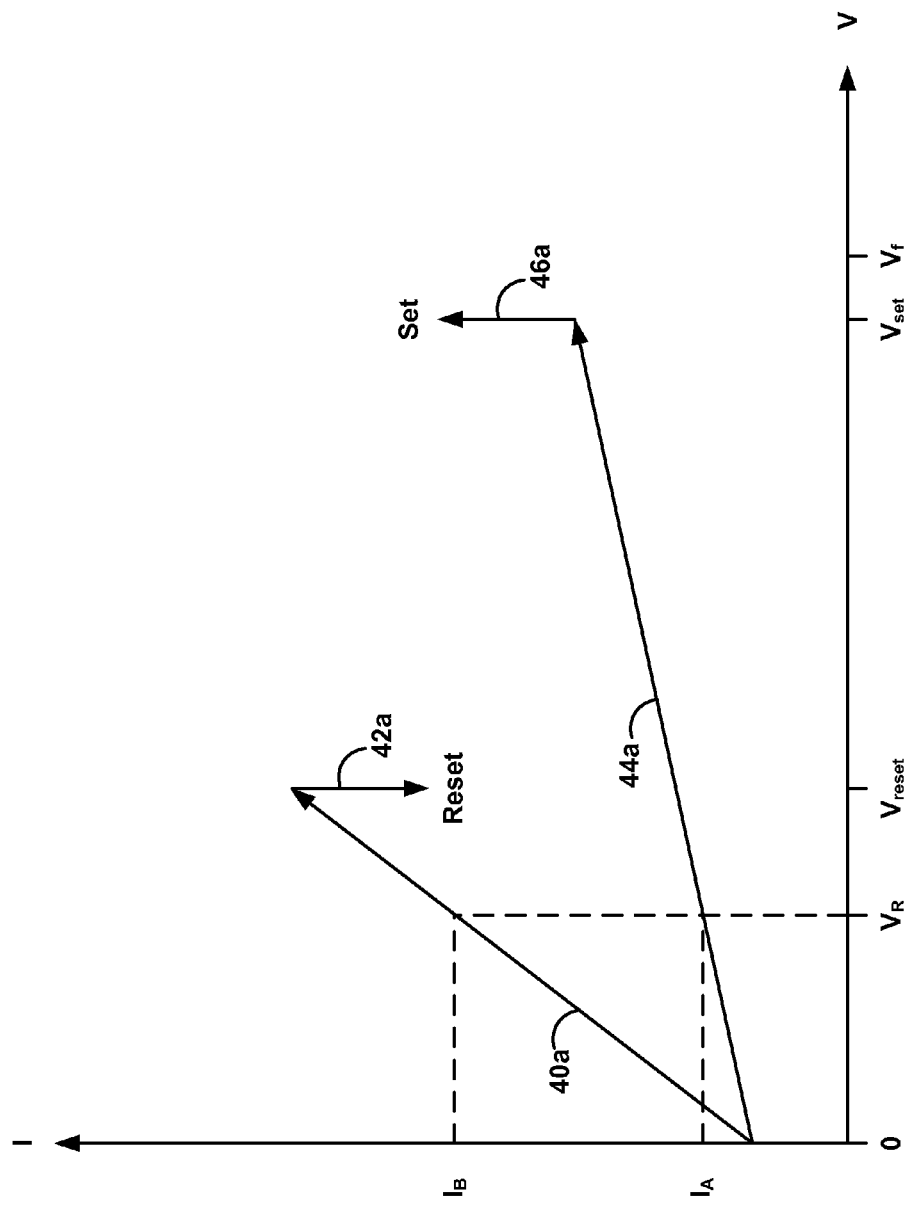
FIGS. 5A-5C illustrate example current and voltage characteristics of memory elements in accordance with this invention.

Referring now to FIG. 5A, a graph of voltage versus current for an example embodiment of memory element 16 is described. In particular, FIG. 5A illustrates an example voltage versus current characteristic for a memory element 16 having a first dielectric material layer 12a and/or the second dielectric material layer 12b that exhibit unipolar resistance-switching characteristics. The x-axis depicts an absolute value of voltage, the y-axis depicts current, and the lines are adjusted to meet at the origin of the graph. In the reset process, line 40a represents the I-V characteristic of memory element 16 in the low-resistivity, set state, and line 42a represents a transition to the high-resistivity, reset state at Vreset. In the set process, line 44a represents the I-V characteristic of memory element 16 in the high-resistivity, reset state, and line 46a represents a transition to the low-resistivity, set state at Vset. The example shows a unipolar operation mode where the polarity of the voltage is the same for the both set and reset switching. In this example, forming voltage Vf>Vset.

To determine the state of memory element 16, a voltage is applied across memory element 16 and the resulting current is measured. A higher or lower measured current indicates that memory element 16 is in the low- or high-resistivity state, respectively. In some cases, the high resistivity state is substantially higher, e.g., two or three orders of magnitude (100-1,000) times higher than the low resistivity state.

When in the reset state, memory element 16 exhibits the resistance characteristics shown by line 44a in response to an applied voltage between 0 and Vset. When in the set state, however, memory element 16 exhibits the resistance characteristics shown by line 40a in response an applied voltage between 0 and Vreset, where Vreset<Vset. Thus, memory element 16 exhibits different resistance characteristics in response to the same voltages in the same voltage range (e.g., between 0 and Vreset) depending on the resistance state of memory element 16.

In a read operation, a fixed voltage VR<Vreset is applied, in response to which the sensed current is IA in the set state, or IB in the reset state. The state of memory element 16 can thus be sensed by identifying at least one point of its I-V characteristic. Example unipolar programming parameters are set forth in Table 2:

TABLE 2

EXAMPLE UNIPOLAR PROGRAMMING PARAMETERS

| PARAMETER | EXAMPLE RANGE | PREFERRED RANGE |
|---|---|---|
| $V_R$ (V) | 1-2 | 1.5-1.8 |
| $V_{reset}$ (V) | 3-7 | 4-6 |
| $V_{set}$ (V) | 7-10 | 6-9 |
| $V_f$ (V) | 5-12 | 6-10 |
| $I_A$ (nA) | 20-150 | 50-100 |
| $I_B$ (nA) | 100-1000 | 250-600 |
| $T_{SET}$ (ns) | 100-1000 | 300-600 |
| $T_{RESET}$ (ns) | 100-1000 | 300-600 |

Persons of ordinary skill in the art will understand other values may be used. Persons of ordinary skill in the art will understand that $V_{SET}$ and $V_{RESET}$ values depend on the on-chip resistance associated with the structure—in an array configuration, the on-chip resistance will depend on the bit location, such as a Near-Near bit needs lower voltages than a Far-Far bit.

Figure 5B:
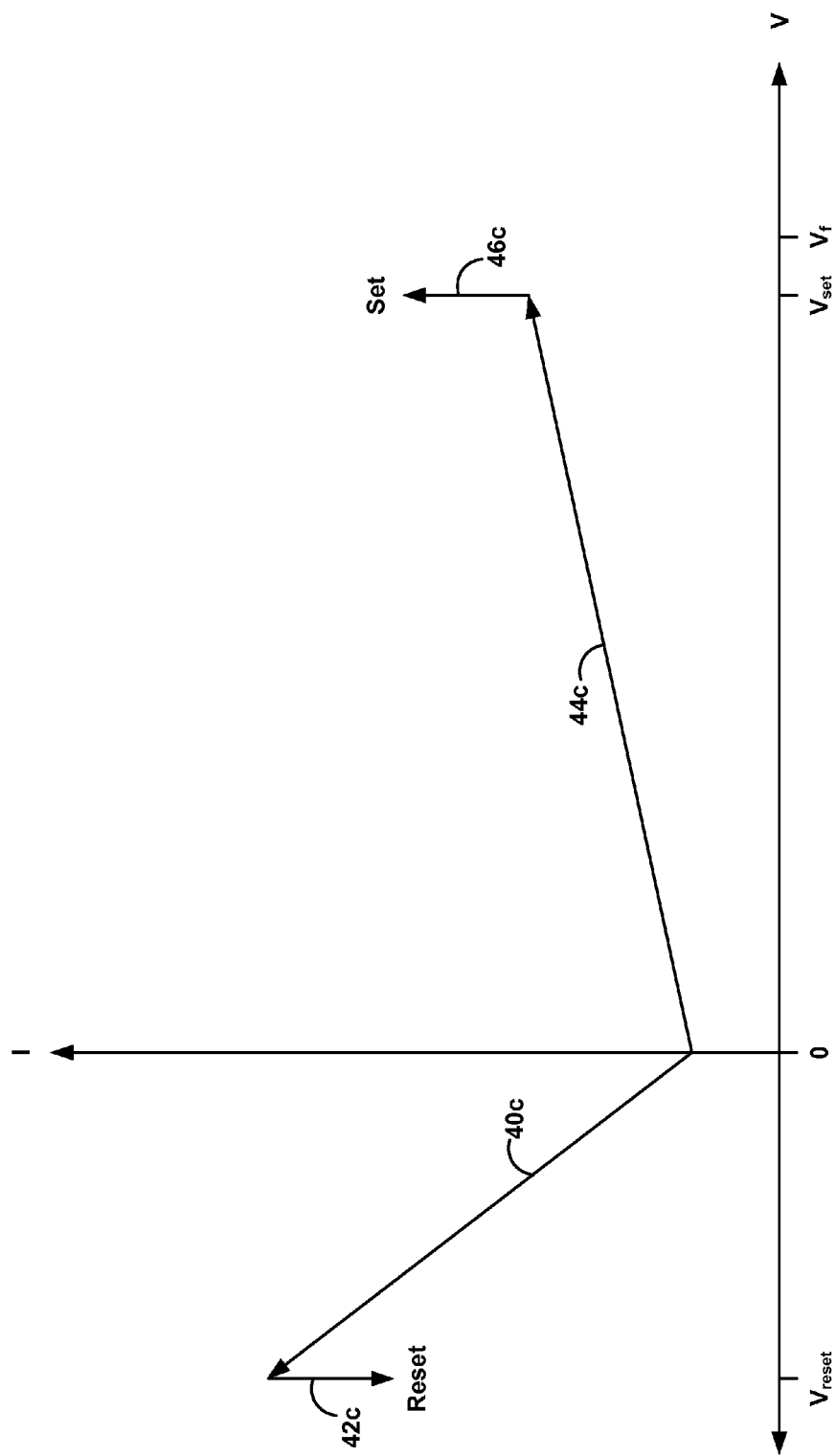

FIG. 5B illustrates a graph of voltage versus current for example embodiments of memory element 16 having a first dielectric material layer 12a and/or a second dielectric material layer 12b that exhibit bipolar resistance-switching characteristics. Here, opposite polarity voltages are used for the set and reset processes. Moreover, positive voltages are used for the set process and negative voltages are used for the reset process. In this bipolar memory element, the set process occurs when a positive voltage is applied, and the reset process occurs when a negative voltage is applied.

In the set process, line 44c represents the I-V characteristic of memory element 16 when in the high-resistivity, reset state, and line 46c represents a transition to the low-resistivity, set state at Vset. In the reset process, line 40c represents the I-V characteristic of memory element 16 when in the low-resistivity, set state, and line 42c represents a transition to the high-resistivity, reset state at Vreset. Vset and Vf are positive voltages and Vreset is a negative voltage. Example bipolar programming parameters are set forth in Table 3:

TABLE 3

EXAMPLE BIPOLAR PROGRAMMING PARAMETERS

| PARAMETER | EXAMPLE RANGE | PREFERRED RANGE |
|---|---|---|
| $V_R$ (V) | 1-2 | 1.5-1.8 |
| $V_{reset}$ (V) | −(9-14.5) | −(10.5-13.5) |
| $V_{set}$ (V) | 4-10 | 6-9 |
| $V_f$ (V) | 5-12 | 6-10 |
| $I_A$ (nA) | 20-150 | 50-100 |
| $I_B$ (nA) | 100-800 | 250-600 |
| $T_{SET}$ (ns) | 20-10000 | 50-1000 |
| $T_{RESET}$ (ns) | 20-10000 | 50-2000 |

Persons of ordinary skill in the art will understand other values may be used. Persons of ordinary skill in the art will understand that $V_{SET}$ and $V_{RESET}$ values depend on the on-chip resistance associated with the structure—in an array configuration, the on-chip resistance will depend on the bit location, such as a Near-Near bit needs lower voltages than a Far-Far bit.

Figure 5C:
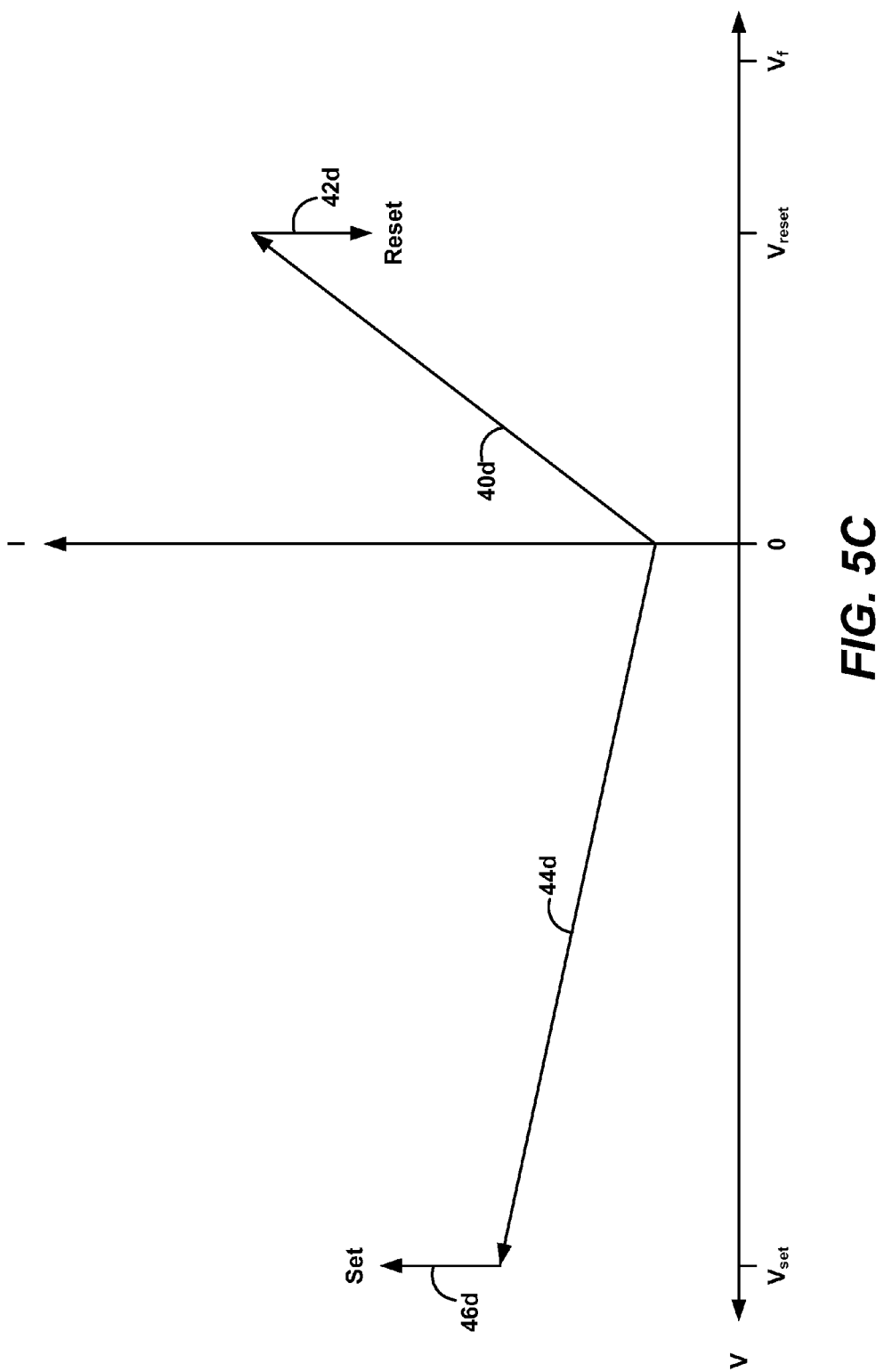

FIG. 5C illustrates a graph of voltage versus current for another example embodiment of memory element 16 having a first dielectric material layer 12a and a second dielectric material layer 12b that exhibit bipolar resistance-switching characteristics. In this bipolar memory element, the reset process occurs when a positive voltage is applied, and the set process occurs when a negative voltage is applied.

In the set process, line 44d represents the I-V characteristic of memory element 16 when in the high-resistivity, reset state, and line 46d represents a transition to the low-resistivity, set state at Vset. In the reset process, line 40d represents the I-V characteristic of memory element 16 when in the low-resistivity, set state, and line 42d represents a transition to the high-resistivity, reset state at Vreset. Vreset and Vf are positive voltages and Vset is a negative voltage. Example bipolar programming parameters are set forth in Table 4:

TABLE 4

EXAMPLE BIPOLAR PROGRAMMING PARAMETERS

| PARAMETER | EXAMPLE RANGE | PREFERRED RANGE |
|---|---|---|
| $V_R$ (V) | 1-2 | 1.5-1.8 |
| $V_{reset}$ (V) | 4-10 | 7-9 |
| $V_{set}$ (V) | −(9.5-15.5) | −(11-14.5) |
| $V_f$ (V) | 5-12 | 6-10 |
| $I_A$ (nA) | 50-150 | 100-200 |
| $I_B$ (nA) | 200-1500 | 500-1000 |
| $T_{SET}$ (ns) | 20-10000 | 50-2000 |
| $T_{RESET}$ (ns) | 20-10000 | 50-1000 |

Persons of ordinary skill in the art will understand other values may be used. Persons of ordinary skill in the art will understand that $V_{SET}$ and $V_{RESET}$ values depend on the on-chip resistance associated with the structure—in an array configuration, the on-chip resistance will depend on the bit location, such as a Near-Near bit needs lower voltages than a Far-Far bit.

Example Fabrication Processes for Memory Cells

Referring now to FIGS. 6A-6E, an example method of forming a memory level in accordance with this invention is described. In particular, FIGS. 6A-6E illustrate an example method of forming a memory level including memory cells 10 of FIG. 3A. As will be described below, the first memory level includes a plurality of memory cells that each include memory cells in accordance with this invention include a memory element 16 that includes a first dielectric material layer disposed above a first conductive material layer, a second conductive material layer disposed above the first dielectric material layer, and a second dielectric material layer disposed above the second conductive material layer. One or both of the first conductive material layer and the second conductive material layer includes a stack of a metal material layer and a highly doped semiconductor material layer. Additional memory levels may be fabricated above the first memory level (as described previously with reference to FIGS. 2C-2D).

Figure 6A:
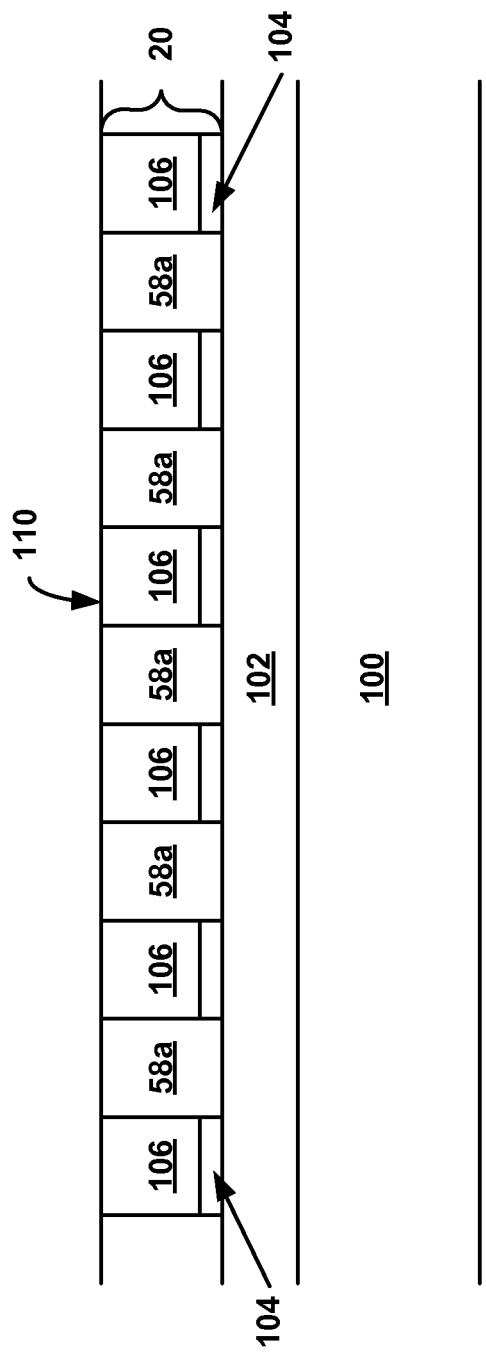
FIGS. 6A-6E illustrate cross-sectional views of a portion of a substrate during an example fabrication of a single memory level in accordance with this invention.

With reference to FIG. 6A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown). Isolation layer 102 is formed above substrate 100. In some embodiments, isolation layer 102 may be a layer of silicon dioxide, silicon nitride, silicon oxynitride or any other suitable insulating layer.

Following formation of isolation layer 102, an adhesion layer 104 is formed over isolation layer 102 (e.g., by PVD or another method). For example, adhesion layer 104 may be between about 20 and about 500 angstroms, and preferably about 100 angstroms, of titanium nitride or another suitable adhesion layer such as tantalum nitride, tungsten nitride, tungsten, molybdenum, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 106 may comprise between about 200 and about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar first conductors 20. Example widths for first conductors 20 and/or spacings between first conductors 20 range between about 200 and about 2500 angstroms, although other conductor widths and/or spacings may be used.

After first conductors 20 have been formed, a dielectric material layer 58a is formed over substrate 100 to fill the voids between first conductors 20. For example, approximately 3000-7000 angstroms of silicon dioxide may be deposited on the substrate 100 and planarized using chemical mechanical polishing or an etchback process to form a planar surface 110. Planar surface 110 includes exposed top surfaces of first conductors 20 separated by dielectric material (as shown). Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments of the invention, first conductors 20 may be formed using a damascene process in which dielectric material layer 58a is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Figure 6B:
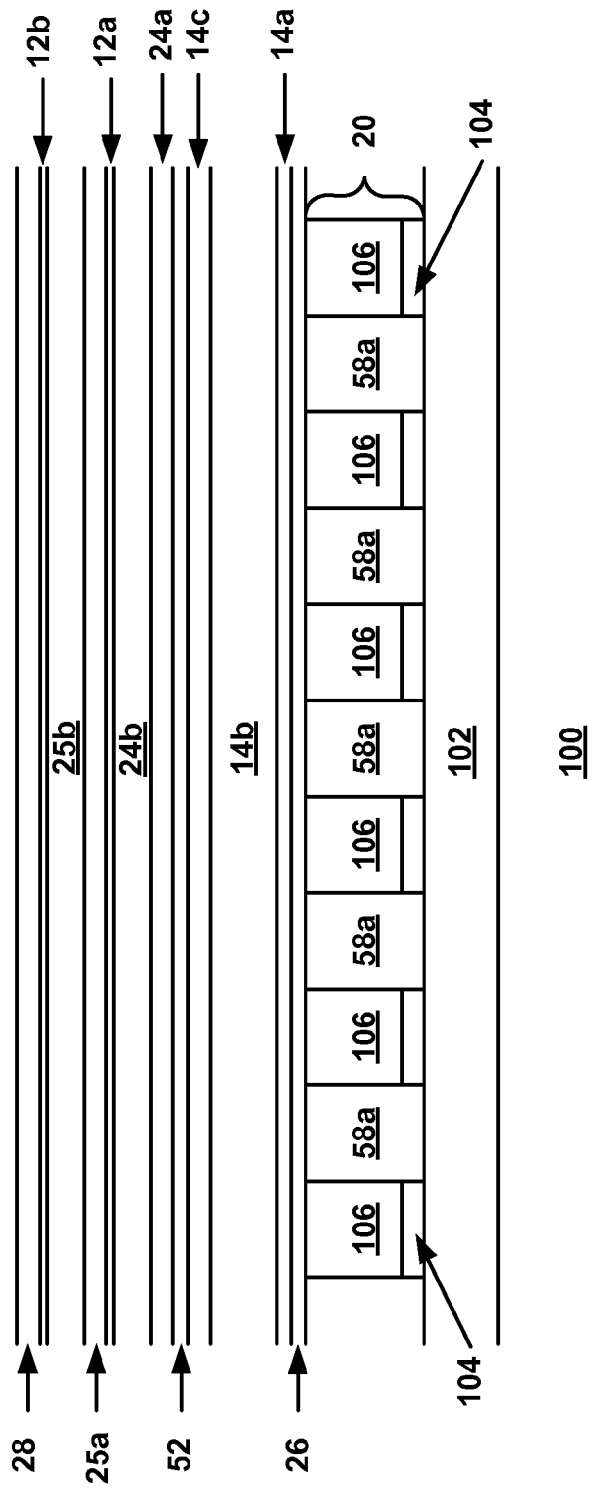

Following planarization, the diode structures of each memory cell are formed. With reference to FIG. 6B, a barrier layer 26 is formed over planarized top surface 110 of substrate 100. In some embodiments, barrier layer 26 may be between about 20 and about 500 angstroms, and preferably about 100 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 26, deposition of the semiconductor material used to form the diode of each memory cell begins (e.g., diode 14 in FIGS. 1 and 3A). Each diode may be a vertical p-n, p-i-n, n-p-n or p-n-p punch-through diode, a carbon diode, or other similar diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used. Example carbon diodes and methods of forming carbon diodes are described the '840 application.

Following formation of barrier layer 26, a heavily doped n+ silicon layer 14a is deposited on barrier layer 26. In some embodiments, n+ silicon layer 14a is in an amorphous state as deposited. In other embodiments, n+ silicon layer 14a is in a polycrystalline state as deposited. CVD or another suitable process may be employed to deposit n+ silicon layer 14a.

In at least one embodiment, n+ silicon layer 14a may be formed, for example, from about 100 to about 1000 angstroms, preferably about 100 angstroms, of phosphorus or arsenic doped silicon having a doping concentration of about 1021 cm-3. Other layer thicknesses, doping types and/or doping concentrations may be used. N+ silicon layer 14a may be doped in situ, for example, by flowing a donor gas during deposition. Other doping methods may be used (e.g., implantation).

After deposition of n+ silicon layer 14a, a lightly doped, intrinsic and/or unintentionally doped silicon layer 14b may be formed over n+ silicon layer 14a. In some embodiments, intrinsic silicon layer 14b may be in an amorphous state as deposited. In other embodiments, intrinsic silicon layer 14b may be in a polycrystalline state as deposited. CVD or another suitable deposition method may be employed to deposit intrinsic silicon layer 14b. In at least one embodiment, intrinsic silicon layer 14b may be about 300 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14a prior to depositing intrinsic silicon layer 14b to prevent and/or reduce dopant migration from n+ silicon layer 14a into intrinsic silicon layer 14b (as described in the '331 Application).

P-type silicon may be either deposited and doped by ion implantation or may be doped in situ during deposition to form a p+ silicon layer 14c. For example, a blanket p+ implant may be employed to implant boron a predetermined depth within intrinsic silicon layer 14b. Example implantable molecular ions include BF2, BF3, B and the like. In some embodiments, an implant dose of about 1-5×1015 ions/cm2 may be employed. Other implant species and/or doses may be used. Further, in some embodiments, a diffusion process may be employed. In at least one embodiment, the resultant p+ silicon layer 14c has a thickness of about 100-700 angstroms, although other p+ silicon layer sizes may be used.

Following formation of p+ silicon layer 14c, a silicide-forming metal layer 52 is deposited over p+ silicon layer 14c. Example silicide-forming metals include sputter or otherwise deposited titanium or cobalt. In some embodiments, silicide-forming metal layer 52 has a thickness of about 10 to about 200 angstroms, preferably about 20 to about 50 angstroms and more preferably about 20 angstroms. Other silicide-forming metal layer materials and/or thicknesses may be used. A nitride layer (not shown) may be formed at the top of silicide-forming metal layer 52.

Following formation of silicide-forming metal layer 52, an RTA step may be performed at about 600° C. for about one minute to form silicide layer 50 (FIG. 3), consuming all or a portion of the silicide-forming metal layer 52. Following the RTA step, any residual nitride layer from silicide-forming metal layer 52 may be stripped using a wet chemistry, as described above. Other annealing conditions may be used.

Following the RTA step and the nitride strip step, bottom electrode 24 is formed above silicide layer 50. In example embodiments of this invention, bottom electrode 24 includes a metal material layer 24a and a highly doped semiconductor material layer 24b formed on metal material layer 24a. Metal material layer 24a may be Ti, TiN, Ta, TaN, W, WN, Mo, TaAlN, VN, VSi3N4, ZrN, ZrSi3N4, HfN, HfSi3N4, TiSi3N4, TaSi3N4, WSi3N4, WAlN, or other similar metal materials. In some embodiments, metal layer 24a may have a thickness of about 100 angstroms to about 300 angstroms, more generally between about 50 angstroms to about 500 angstroms. Other thicknesses may be used.

As described above, metal material layer 24a may be formed by CVD, PVD, sputter deposition, or other similar processes. In at least one embodiment, metal material layer 24a may be deposited without a pre-clean or pre-sputter step prior to deposition. Example deposition process conditions are as set forth in Table 5 for forming a TiN metal material layer 24a.

TABLE 5

EXAMPLE TiN DEPOSITION PARAMETERS

| PROCESS PARAMETER | EXAMPLE RANGE | PREFERRED RANGE |
| --- | --- | --- |
| Argon Flow Rate (sccm) | 20-40 | 20-30 |
| Ar With Dilute H$_2$ (<10%) Flow Rate (sccm) | 0-30 | 0-10 |
| Nitrogen Flow Rate (sccm) | 50-90 | 60-70 |
| Pressure (milliTorr) | 1-5000 | 1800-2400 |
| Power (Watts) | 10-9000 | 2000-9000 |
| Power Ramp Rate (Watts/sec) | 10-5000 | 2000-4000 |
| Process Temperature (° C.) | 100-600 | 200-350 |
| Deposition Time (sec) | 5-200 | 10-150 |

Other flow rates, pressures, powers, power ramp rates, process temperatures and/or deposition times may be used.

Example deposition chambers include the Endura 2 tool available from Applied Materials, Inc. of Santa Clara, Calif. Other processing tools may be used. In some embodiments, a buffer chamber pressure of about 1-2×10-7 Torr and a transfer chamber pressure of about 2-5×10-8 Torr may be used. The deposition chamber may be stabilized for about 250-350 seconds with about 60-80 sccm Ar, 60-70 sccm N2, and about 5-10 sccm of Ar with dilute H2 at about 1800-2400 milliTorr. In some embodiments, it may take about 2-5 seconds to strike the target. Other buffer chamber pressures, transfer chamber pressures and/or deposition chamber stabilization parameters may be used.

Highly doped semiconductor material layer 24b is formed on metal material layer 24a. Highly doped semiconductor material layer 24b may be n+ poly, p+ poly, n+ poly with Ge (10-20%), p+ poly with Ge (10-20%), or other similar highly doped semiconductor material. In at least one embodiment, highly doped semiconductor material layer 24b may be n+ poly, for example, from about 100 to about 1000 angstroms, preferably about 200 angstroms, of phosphorus or arsenic doped silicon having a doping concentration of between about 1×1020 cm-3 and about 1×1022 cm-3. Other layer thicknesses, doping types and/or doping concentrations may be used. N+ poly layer 24b may be doped in situ, for example, by flowing a donor gas during deposition. Other doping methods may be used (e.g., implantation).

First dielectric material layer 12a is formed over highly doped semiconductor material layer 24b. In some embodiments, first dielectric material layer 12a may have a thickness of about 20 angstroms to about 30 angstroms, more generally between about 10 angstroms to about 50 angstroms, although other thicknesses may be used. First dielectric material layer 12a may be SiO2, HfO2, SiON, HfSiON, HfSiOx, HfAlxOy, Al2O3, Si3N4, ZrO2, La2O3, Ta2O5, TiO2, SrTiO3, VO2, VSiO or other similar dielectric materials. First dielectric material layer 12a may be formed using any suitable formation process, such as ALD, PVD, RTO, HDP-CVD, SPA, MOCVD, DLI-MOCVD or other similar process.

Intermediate electrode 25 is formed above first dielectric material layer 12a. In example embodiments of this invention, intermediate electrode 25 includes a metal material layer 25a and a highly doped semiconductor material layer 25b formed on metal material layer 25a. Metal material layer 25a may be Ti, TiN, Ta, TaN, W, WN, Mo, TaAlN, VN, VSi3N4, ZrN, ZrSi3N4, HfN, HfSi3N4, TiSi3N4, TaSi3N4, WSi3N4, WAlN, carbon, a noble metal, such as Pt, or other similar metal materials. In some embodiments, metal layer 25a may have a thickness of about 100 angstroms to about 300 angstroms, more generally between about 50 angstroms to about 500 angstroms. Other thicknesses may be used.

As described above, metal material layer 25a may be formed by CVD, PVD, sputter deposition, or other similar processes. In at least one embodiment, metal material layer 25a may be deposited without a pre-clean or pre-sputter step prior to deposition. Example deposition process conditions are as set forth in Table 1, above, for forming a TiN metal material layer 25a.

Highly doped semiconductor material layer 25b is formed on metal material layer 25a. Highly doped semiconductor material layer 25b may be n+ poly, p+ poly, n+ poly with Ge (10-20%), p+ poly with Ge (10-20%), or other similar highly doped semiconductor material. In at least one embodiment, highly doped semiconductor material layer 25b may be n+ poly, for example, from about 100 to about 1000 angstroms, preferably about 200 angstroms, of phosphorus or arsenic doped silicon having a doping concentration of between about 1×1020 cm-3 and about 1×1022 cm-3. Other layer thicknesses, doping types and/or doping concentrations may be used. N+ poly layer 25b may be doped in situ, for example, by flowing a donor gas during deposition. Other doping methods may be used (e.g., implantation).

Second dielectric material layer 12b is formed over highly doped semiconductor material layer 25b. In some embodiments, second dielectric material layer 12b may have a thickness of about 30 angstroms to about 50 angstroms, more generally between about 20 angstroms to about 60 angstroms, although other thicknesses may be used. Second dielectric material layer 12b may be SiO2, HfO2, SiON, HfSiON, HfSiOx, HfAlxOy, Al2O3, Si3N4, ZrO2, La2O3, Ta2O5, TiO2, SrTiO3, VO2, VSiO, or other similar dielectric materials. Second dielectric material layer 12b may be formed using any suitable formation process, such as ALD, PVD, RTO, HDP-CVD, SPA, MOCVD, DLI-MOCVD or other similar process.

Persons of ordinary skill in the art will understand that first dielectric material layer 12a and second dielectric material layer 12b may be the same thickness, or may have different thickness from one another. Further, different process flows and recipes (such as film growth conditions, stoichiometry, gas flow, etc.) can be used to control the type and quality of the film and their respective interfaces to achieve reproducible memory states.

Top electrode 28 is formed above second dielectric material layer 12b. Top electrode 28 may be about 20 angstroms to about 100 angstroms, more generally between about 10 angstroms and about 250 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

In at least one embodiment, top electrode 28 may be deposited without a pre-clean or pre-sputter step prior to deposition. Top electrode 28 may be formed by ALD, CVD, PVD, sputter deposition, or other similar processes. Example deposition process conditions are as set forth above in Table 1.

Figure 6C:
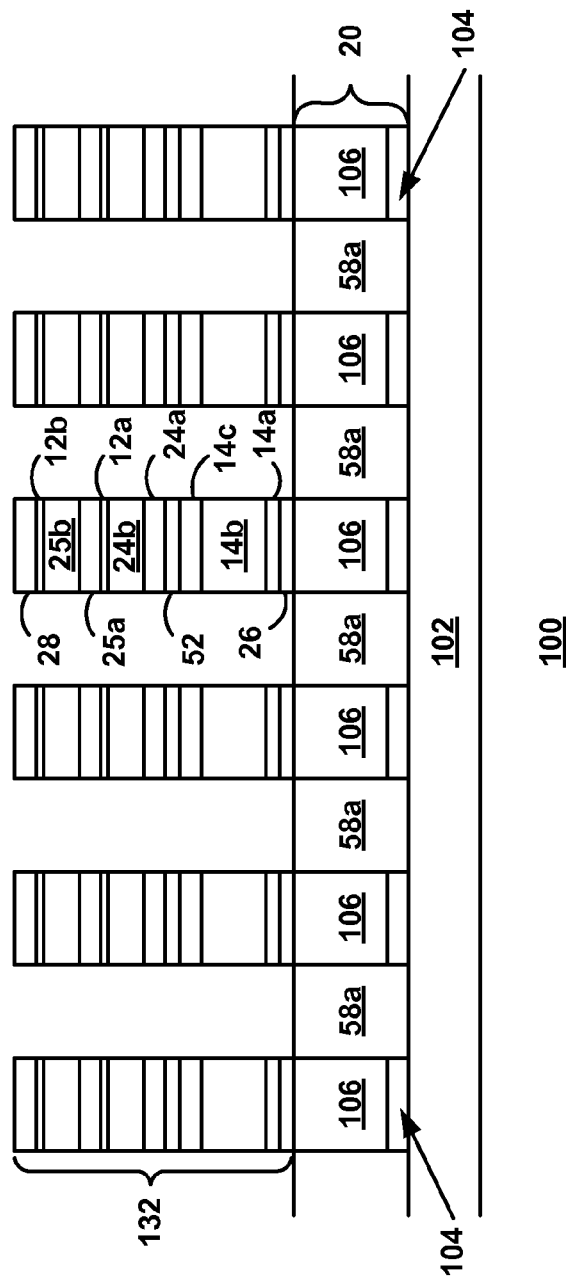
Figure 6D:
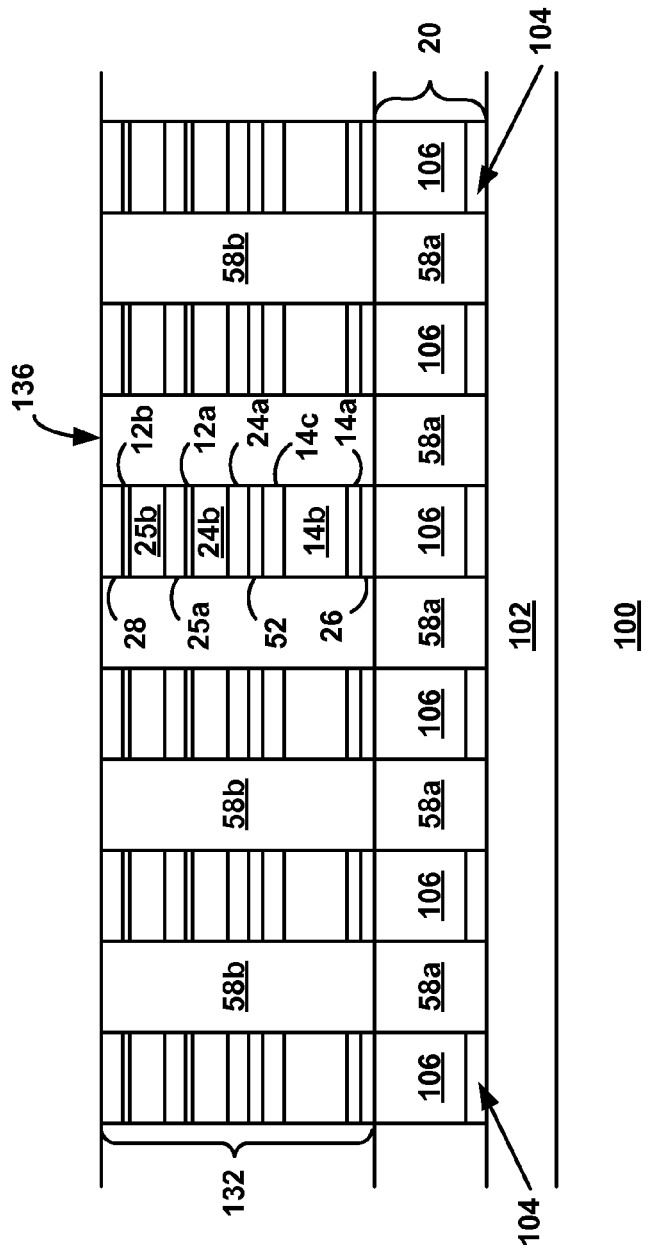

As shown in FIG. 6C, top electrode 28, second dielectric material layer 12b, highly doped semiconductor material layer 25b, metal layer 25a, first dielectric material layer 12a, highly doped semiconductor material layer 24b, metal layer 24a, silicide-forming metal layer 52, diode layers 14a-14c, and barrier layer 26 are patterned and etched to form pillars 132. Pillars 132 may be formed above corresponding conductors 20 and have substantially the same width as conductors 20, for example, although other widths may be used. Some misalignment may be tolerated. The memory cell layers may be patterned and etched in a single pattern/etch procedure or using separate pattern/etch steps. In at least one embodiment, top electrode 28, second dielectric material layer 12b, highly doped semiconductor material layer 25b, metal layer 25a, first dielectric material layer 12a, highly doped semiconductor material layer 24b, and metal layer 24a are etched together to form memory element 16 (FIG. 3A).

For example, photoresist may be deposited, patterned using standard photolithography techniques, layers 26, 14a-14c, 52, 24a, 24b, 12a, 25a, 25b, 12b, and 28 may be etched, and then the photoresist may be removed. Alternatively, a hard mask of some other material, for example silicon dioxide, may be formed on top of top electrode 28, with bottom antireflective coating ("BARC") on top, then patterned and etched. Similarly, dielectric antireflective coating ("DARC") and/or amorphous carbon film (e.g., the Advanced Patterning Film from Applied Materials, Santa Clara, Calif.) may be used as a hard mask. In some embodiments, one or more additional metal layers may be formed above memory element 16 and diode 14 and used as a metal hard mask that remains part of pillars 132.

Pillars 132 may be formed using any suitable masking and etching process. For example, layers 26, 14a-14c, 52, 24a, 24b, 12a, 25a, 25b, 12b, and 28 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, pillars 132 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5-1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

A dielectric material layer 58b is deposited over pillars 132 to fill the voids between pillars 132. For example, approximately 2000-7000 angstroms of silicon dioxide may be deposited and planarized using chemical mechanical polishing or an etch-back process to form a planar surface 136, resulting in the structure illustrated in FIG. 6D. Planar surface 136 includes exposed top surfaces of pillars 132 separated by dielectric material 58b (as shown). Other dielectric materials such as silicon nitride, silicon oxynitride, low K dielectrics, etc., and/or other dielectric material layer thicknesses may be used.

Figure 6E:
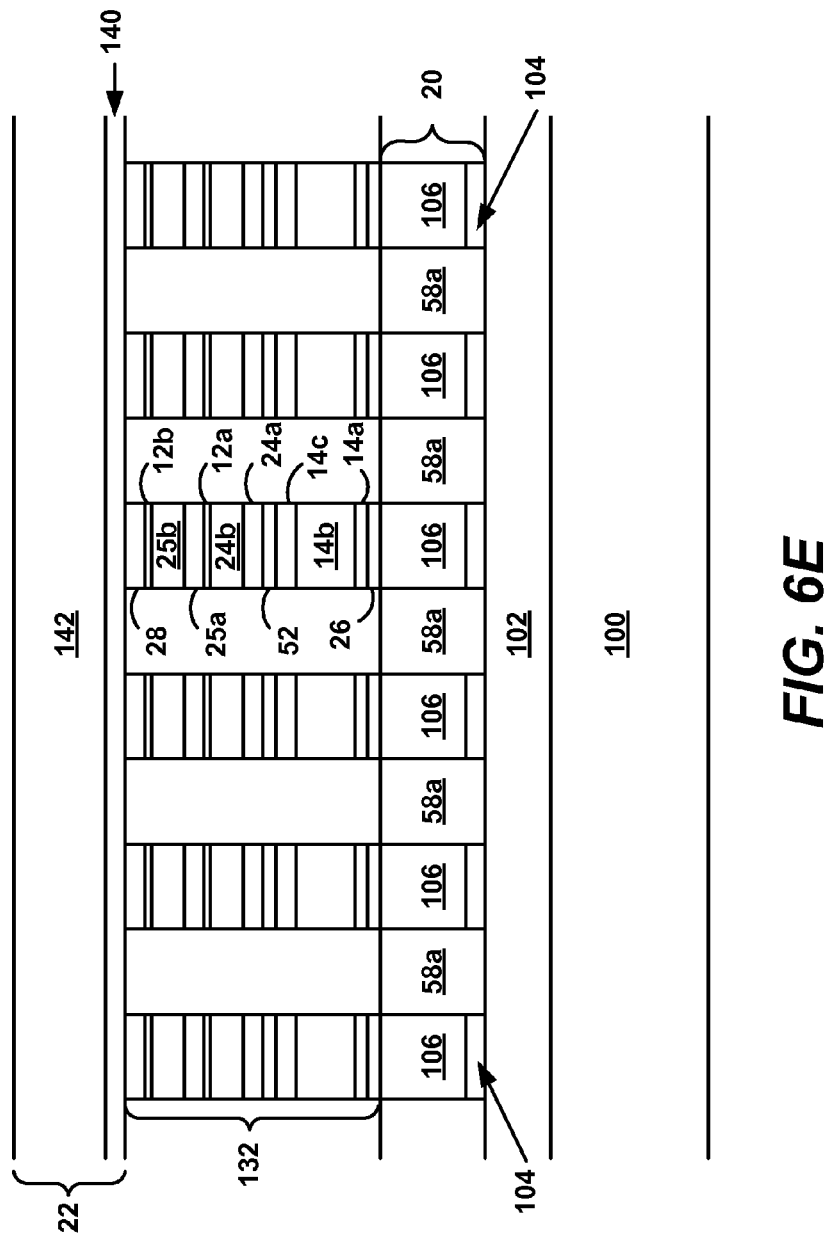

With reference to FIG. 6E, second conductors 22 may be formed above pillars 132 in a manner similar to the formation of first conductors 20. For example, in some embodiments, one or more barrier layers and/or adhesion layers 140 may be deposited over pillars 132 prior to deposition of a conductive layer 142 used to form second conductors 22.

Barrier layer and/or adhesion layer 140 may include titanium nitride or another suitable layer such as tantalum nitride, tungsten nitride, tungsten, molybdenum, combinations of one or more layers, or any other suitable material(s). Conductive layer 142 may be formed from any suitable conductive material such as tungsten, another suitable metal, heavily doped semiconductor material, a conductive silicide, a conductive silicide-germanide, a conductive germanide, or the like deposited by PVD or any other any suitable method (e.g., CVD, etc.). Other conductive layer materials may be used.

Conductive layer 142 and barrier and/or adhesion layer 140 may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric material layer is formed, patterned and etched to create openings or voids for conductors 22. The openings or voids may be filled with adhesion layer 140 and conductive layer 142 (and/or a conductive seed, conductive fill and/or barrier layer if needed). Adhesion layer 140 and conductive layer 142 then may be planarized to form a planar surface.

Following formation of second conductors 22, the resultant structure may be annealed to crystallize the deposited semiconductor material of diodes 14 (and/or to form silicide regions by reaction of the silicide-forming metal layer 52 with p+ region 14c). In alternative embodiments, the arrangements of the doped silicon layers is reversed, so silicide-forming metal layer 52 is in contact with n+ region 14a. The lattice spacing of titanium silicide and cobalt silicide are close to that of silicon, and it appears that such silicide layers may serve as "crystallization templates" or "seeds" for adjacent deposited silicon as the deposited silicon crystallizes. Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments such as spike anneal, laser anneal may also be used.

Additional memory levels may be similarly formed above the memory level of FIGS. 6A-6E. Persons of ordinary skill in the art will understand that alternative memory cells in accordance with this invention may be fabricated with other suitable techniques.

The foregoing description discloses only example embodiments of the invention. Modifications of the above disclosed apparatus and methods which fall within the scope of the invention will be readily apparent to those of ordinary skill in the art. For instance, in any of the above embodiments, the memory elements 16 may be located below diodes 14.

Accordingly, although the present invention has been disclosed in connection with example embodiments thereof, it should be understood that other embodiments may fall within the spirit and scope of the invention, as defined by the following claims.

The invention claimed is:

1. A method comprising:
providing a memory cell comprising a memory element comprising a first conductive material layer, a first dielectric material layer disposed above the first conductive material layer, a second conductive material layer disposed above the first dielectric material layer, a second dielectric material layer disposed above the second conductive material layer, and a third conductive material layer disposed above the second dielectric material layer, wherein one or both of the first conductive material layer and the second conductive material layer comprises a stack of a metal material layer and a highly doped semiconductor material layer, wherein the memory cell has a first memory state upon fabrication corresponding to a first read current; and
applying a first programming pulse to the memory cell with a first current limit, wherein the first programming pulse programs the memory cell to a second memory state that corresponds to a second read current greater than the first read current.

2. The method of claim 1, further comprising applying a second programming pulse to the memory cell with a second current limit higher than the first current limit, wherein the second programming pulse programs the memory cell to a third memory state that corresponds to a third read current greater than the second read current.

3. The method of claim 2, further comprising applying a third programming pulse to the memory cell without a current limit, wherein the third programming pulse programs the memory cell to a fourth memory state that corresponds to a fourth read current greater than the third read current.

4. The method of claim 1, wherein the first conductive material layer comprises one or more of titanium, titanium nitride, tantalum, tantalum nitride, tungsten, tungsten nitride, vanadium nitride, vanadium silicon nitride, zirconium nitride, zirconium silicon nitride, hafnium nitride, hafnium silicon nitride, titanium silicon nitride, tantalum silicon nitride, tungsten silicon nitride, tungsten aluminum nitride and carbon.

5. The method of claim 1, wherein the first conductive material layer comprises highly doped n+ polysilicon, highly doped p+ polysilicon, or highly doped polycrystalline silicon-germanium alloys.

6. The method of claim 1, wherein the second conductive material layer comprises one or more of titanium, titanium nitride, tantalum, tantalum nitride, tungsten, tungsten nitride, vanadium nitride, vanadium silicon nitride, zirconium nitride, zirconium silicon nitride, hafnium nitride, hafnium silicon nitride, titanium silicon nitride, tantalum silicon nitride, tungsten silicon nitride, tungsten aluminum nitride and carbon.

7. The method of claim 1, wherein the second conductive material layer comprises highly doped n+ polysilicon, highly doped p+ polysilicon, or highly doped polycrystalline silicon-germanium alloys.

8. The method of claim 1, wherein the first dielectric material layer comprises one or more of $SiO_2$, $HfO_2$, SiON, HfSiON, $HfSiO_x$, $HfAl_xO_y$, $Al_2O_3$, $Si_3N_4$, $ZrO_2$, $La_2O_3$, $Ta_2O_5$, $TiO_2$, $SrTiO_3$, $VO_2$, and VSiO.

9. The method of claim 1, wherein the second dielectric material layer comprises one or more of $SiO_2$, $HfO_2$, SiON, HfSiON, $HfSiO_x$, $HfAl_xO_y$, $Al_2O_3$, $Si_3N_4$, $ZrO_2$, $La_2O_3$, $Ta_2O_5$, $TiO_2$, $SrTiO_3$, $VO_2$, and VSiO.

10. A method comprising:
providing a memory cell comprising a memory element comprising a first conductive material layer, a first dielectric material layer disposed above the first conductive material layer, a second conductive material layer disposed above the first dielectric material layer, a second dielectric material layer disposed above the second conductive material layer, and a third conductive material layer disposed above the second dielectric material layer, wherein one or both of the first conductive material layer and the second conductive material layer comprises a stack of a metal material layer and a highly doped semiconductor material layer; and
applying voltage pulses to the memory cell to reversibly switch the memory element between a low-resistivity state and a high-resistivity state.

11. The method of claim 10, wherein the first conductive material layer comprises one or more of titanium, titanium nitride, tantalum, tantalum nitride, tungsten, tungsten nitride, vanadium nitride, vanadium silicon nitride, zirconium nitride, zirconium silicon nitride, hafnium nitride, hafnium silicon nitride, titanium silicon nitride, tantalum silicon nitride, tungsten silicon nitride, tungsten aluminum nitride and carbon.

12. The method of claim 10, wherein the first conductive material layer comprises highly doped n+ polysilicon, highly doped p+ polysilicon, or highly doped polycrystalline silicon-germanium alloys.

13. The method of claim 10, wherein the second conductive material layer comprises one or more of titanium, titanium nitride, tantalum, tantalum nitride, tungsten, tungsten nitride, vanadium nitride, vanadium silicon nitride, zirconium nitride, zirconium silicon nitride, hafnium nitride, hafnium silicon nitride, titanium silicon nitride, tantalum silicon nitride, tungsten silicon nitride, tungsten aluminum nitride and carbon.

14. The method of claim 10, wherein the second conductive material layer comprises highly doped n+ polysilicon, highly doped p+ polysilicon, or highly doped polycrystalline silicon-germanium alloys.

15. The method of claim 10, wherein the first dielectric material layer comprises one or more of $SiO_2$, $HfO_2$, SiON, HfSiON, $HfSiO_x$, $HfAl_xO_y$, $Al_2O_3$, $Si_3N_4$, $ZrO_2$, $La_2O_3$, $Ta_2O_5$, $TiO_2$, $SrTiO_3$, $VO_2$, and VSiO.

16. The method of claim 10, wherein the second dielectric material layer comprises one or more of $SiO_2$, $HfO_2$, SiON, HfSiON, $HfSiO_x$, $HfAl_xO_y$, $Al_2O_3$, $Si_3N_4$, $ZrO_2$, $La_2O_3$, $Ta_2O_5$, $TiO_2$, $SrTiO_3$, $VO_2$, and VSiO.

* * * * *